(12) United States Patent  
Chen et al.

(10) Patent No.: US 9,355,735 B1
(45) Date of Patent: May 31, 2016

(54) DATA RECOVERY IN A 3D MEMORY DEVICE WITH A SHORT CIRCUIT BETWEEN WORD LINES

(71) Applicant: SanDisk Technologies Inc., Plano, TX (US)

(72) Inventors: Jian Chen, San Jose, CA (US); Jiahui Yuan, Fremont, CA (US); Yingda Dong, San Jose, CA (US); Charles Kwong, Redwood City, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/627,575

(22) Filed: Feb. 20, 2015

(51) Int. Cl.
  *G11C 29/04* (2006.01)
  *G11C 16/34* (2006.01)
  *G11C 16/10* (2006.01)
  *G11C 16/26* (2006.01)

(52) U.S. Cl.
  CPC ............... *G11C 16/34* (2013.01); *G11C 16/10* (2013.01); *G11C 16/26* (2013.01)

(58) Field of Classification Search
  CPC ........... G11C 16/0483; G11C 16/0408; G11C 29/883; G11C 29/886; G11C 5/02; G11C 5/06
  See application file for complete search history.

(56) References Cited

U.S. PATENT DOCUMENTS

| | | | |
|---|---|---|---|
| 5,606,527 A | 2/1997 | Kwack et al. | |
| 6,307,778 B1 | 10/2001 | Micheloni et al. | |
| 6,545,910 B2 | 4/2003 | Byeon et al. | |
| 7,613,045 B2 | 11/2009 | Murin et al. | |
| 8,437,193 B1 | 5/2013 | Yang | |
| 8,514,630 B2* | 8/2013 | Huynh | G11C 29/02 365/185.21 |
| 8,526,241 B2 | 9/2013 | Shirakawa | |
| 8,693,254 B2 | 4/2014 | Hashimoto | |
| 8,730,722 B2 | 5/2014 | Koh et al. | |
| 8,775,901 B2* | 7/2014 | Sharon | G06F 11/1048 714/763 |
| 8,811,082 B2 | 8/2014 | Kwon et al. | |
| 2010/0322000 A1 | 12/2010 | Shim et al. | |
| 2011/0317489 A1 | 12/2011 | Kim et al. | |
| 2013/0308384 A1 | 11/2013 | Shirakawa | |
| 2014/0071758 A1 | 3/2014 | Maejima | |

OTHER PUBLICATIONS

"Flash Memory Device", https://web2.ph.utexas.edu/ygong/flash.html, no date, pp. 1-4.*

* cited by examiner

*Primary Examiner* — Andrew Q Tran
(74) *Attorney, Agent, or Firm* — Vierra Magen Marcus LLP

(57) ABSTRACT

Techniques for detecting word line layers which are shorted together due to a defect in a three-dimensional stack memory device, and for recovering data. The memory device comprises blocks of memory cells in which each block has a separate stack of word line layers but the word line layers at a common height in the different stacks are connected. A process to detect a short circuit occurs when an nth word line layer (WLn) in an ith block fails to successfully complete programming. A determination is made as to whether WLn is shorted to WLn−1 and/or WLn+1. If WLn is shorted to WLn+1 but not WLn−1 in the ith block, a recovery read process is performed to read the data which has been programmed into the memory cells of WLn of the previously-programmed blocks. The recovery read process uses upshifted control gate read voltages due to the short circuit.

23 Claims, 20 Drawing Sheets

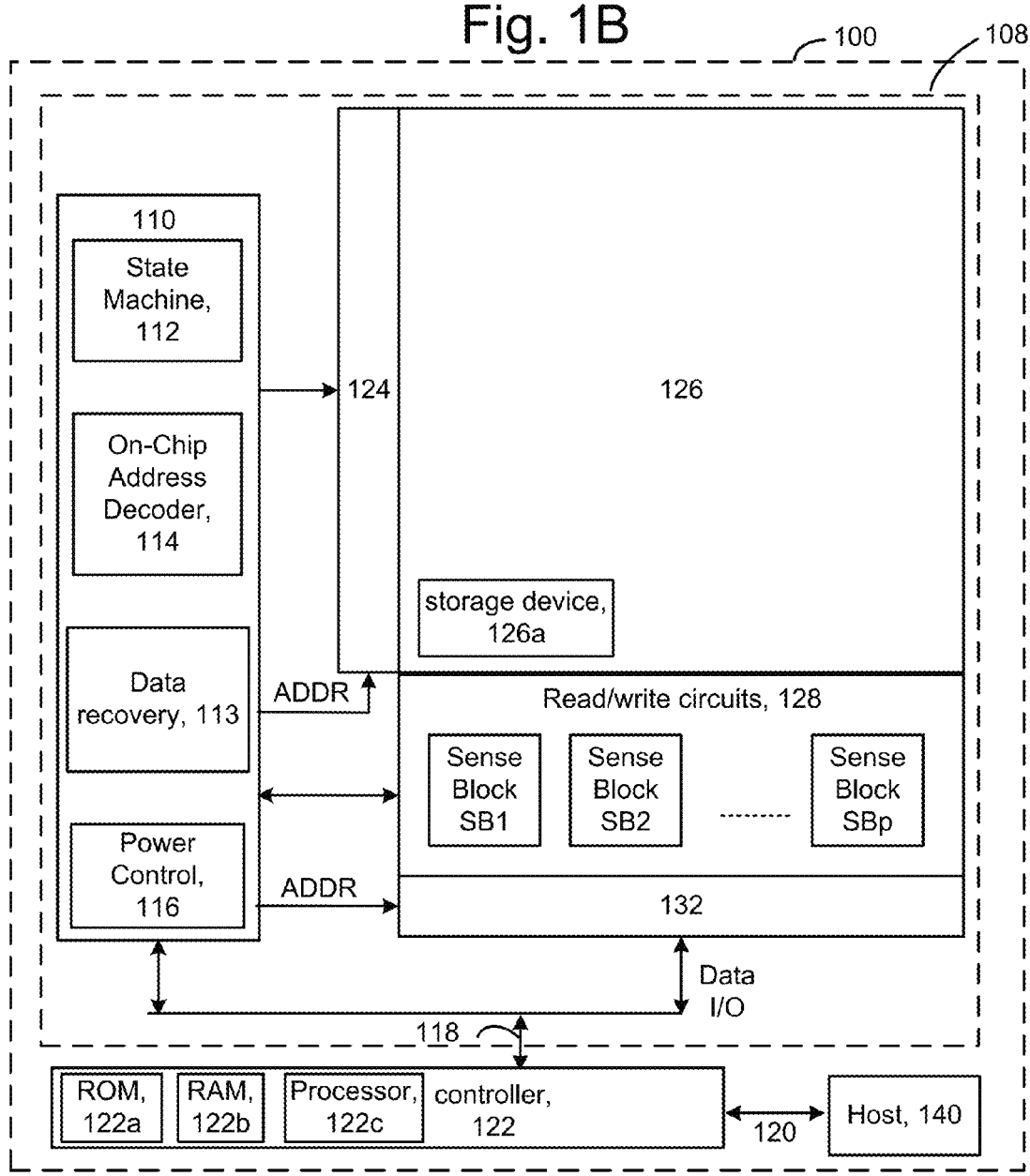

Code in storage device (150)
boot code (151)
control code / set of instructions (160)
    instructions to detect a failure in an attempt to program data into memory cells of a word line layer WLn in a block (161)
    instructions to determine that WLn is shorted to WLn+1 but not WLn-1 (162)
    instructions to read data from memory cells in WLn in previously-programmed blocks using upshifted control gate read voltages (163)
    instructions to program the recovered data to another set of blocks (164)

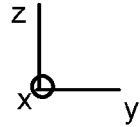
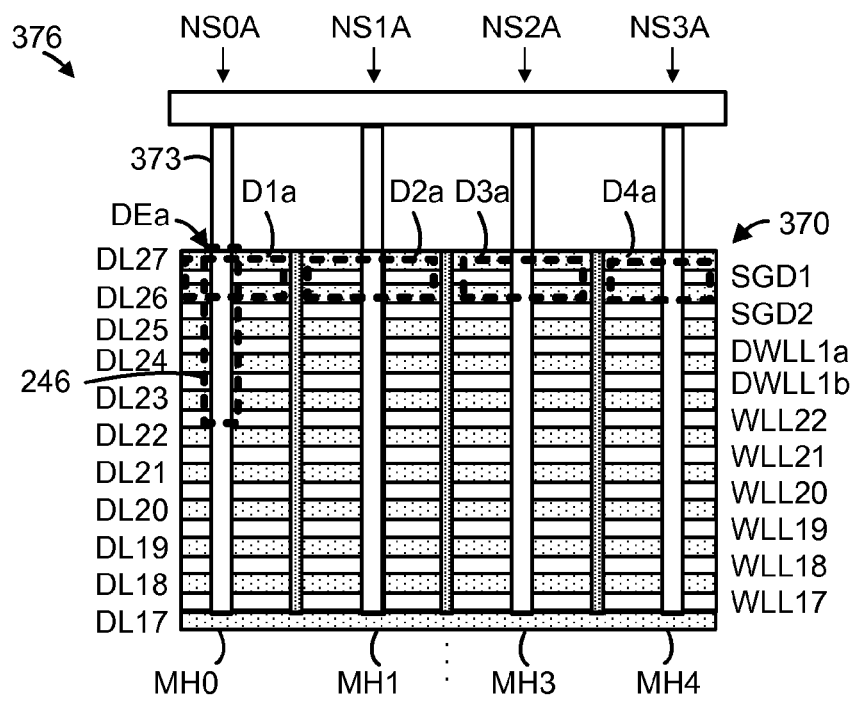
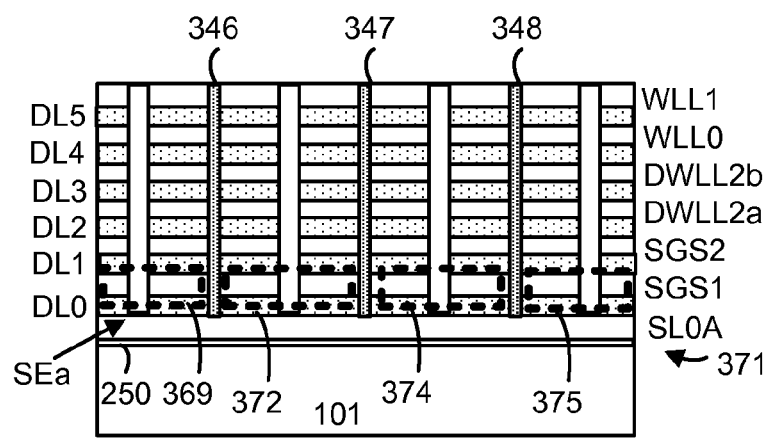

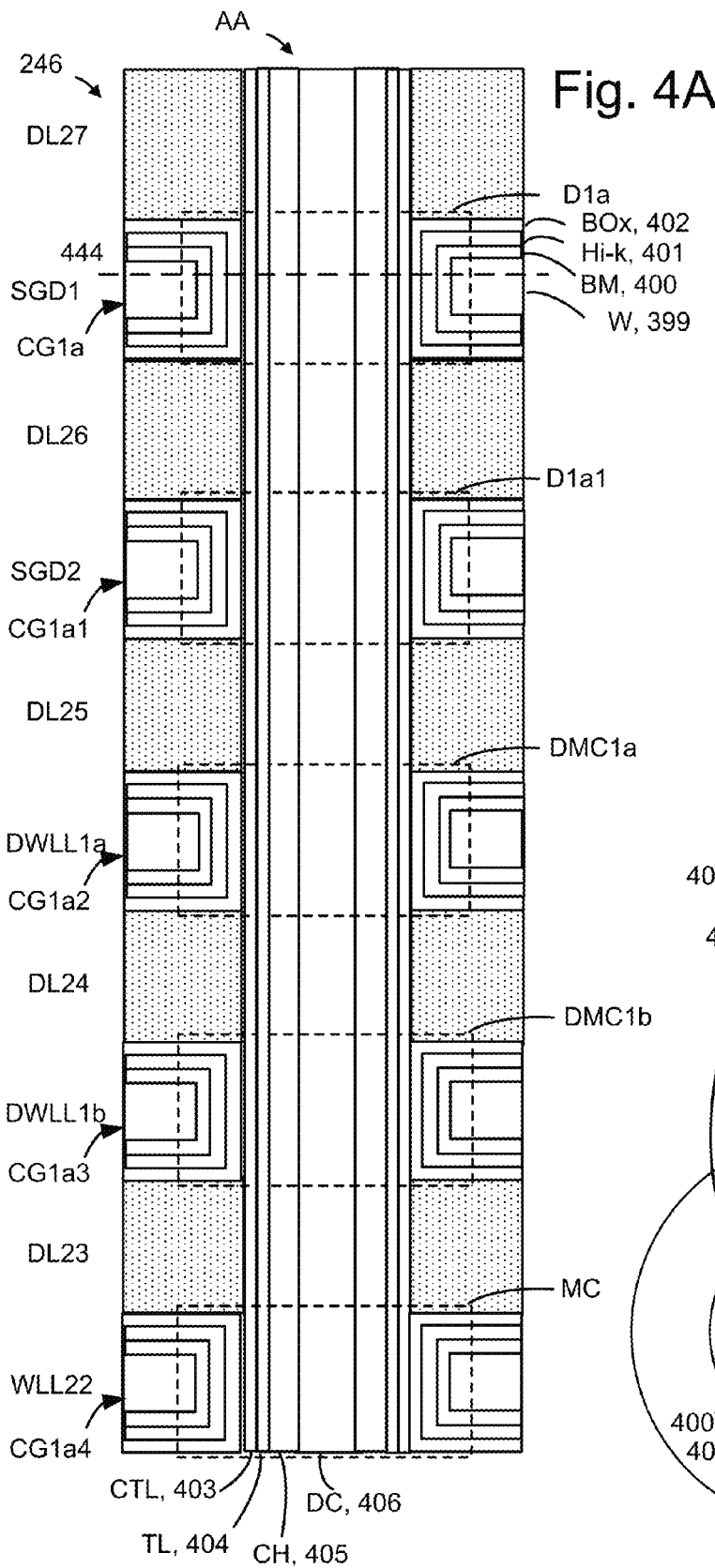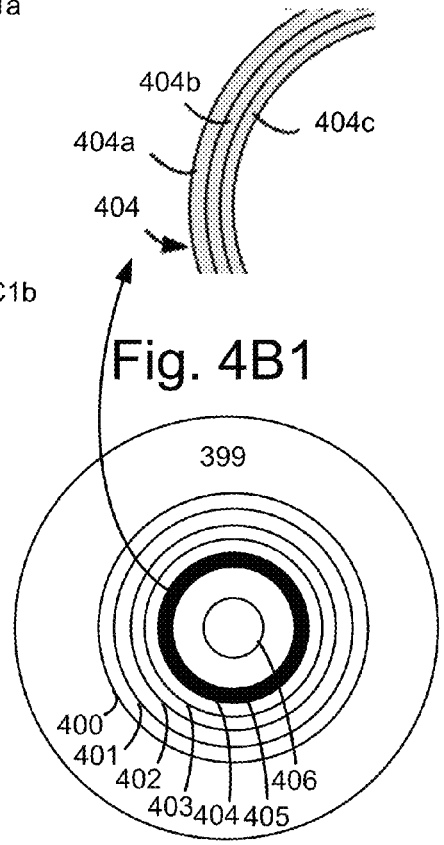

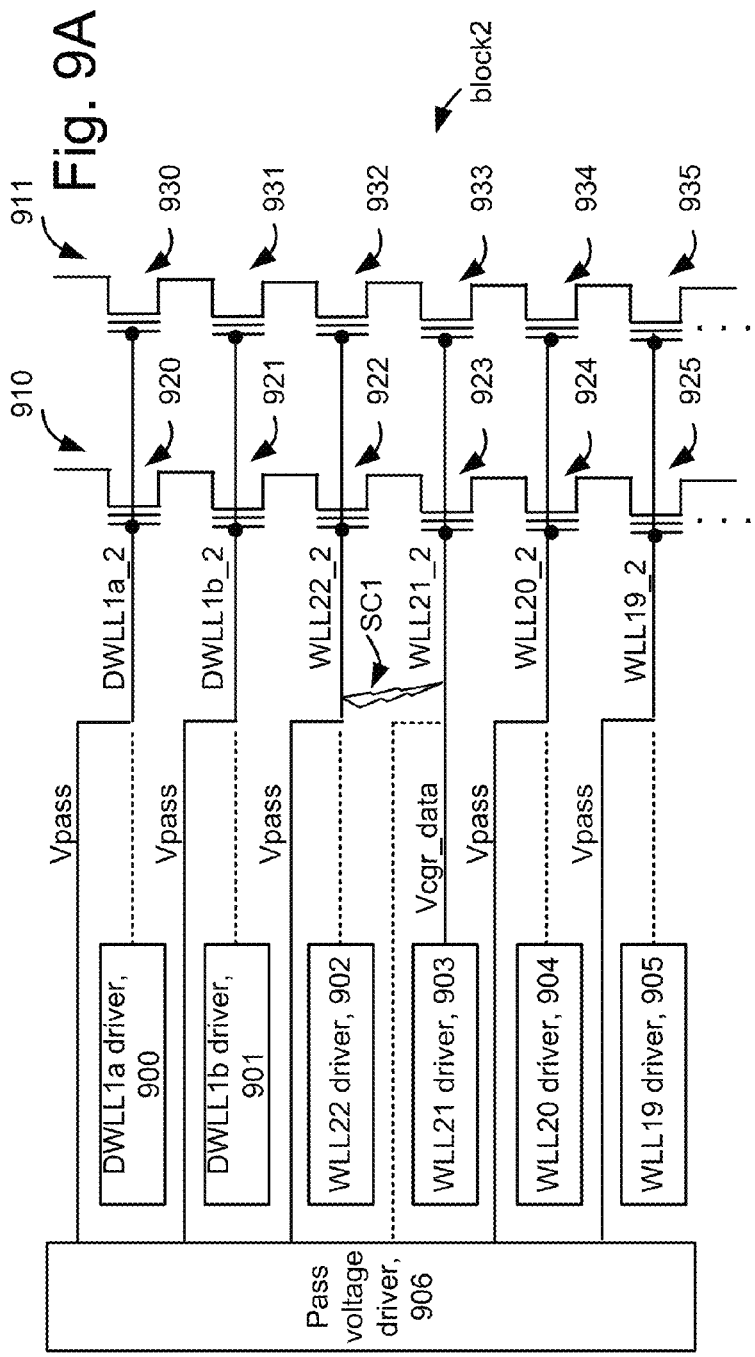

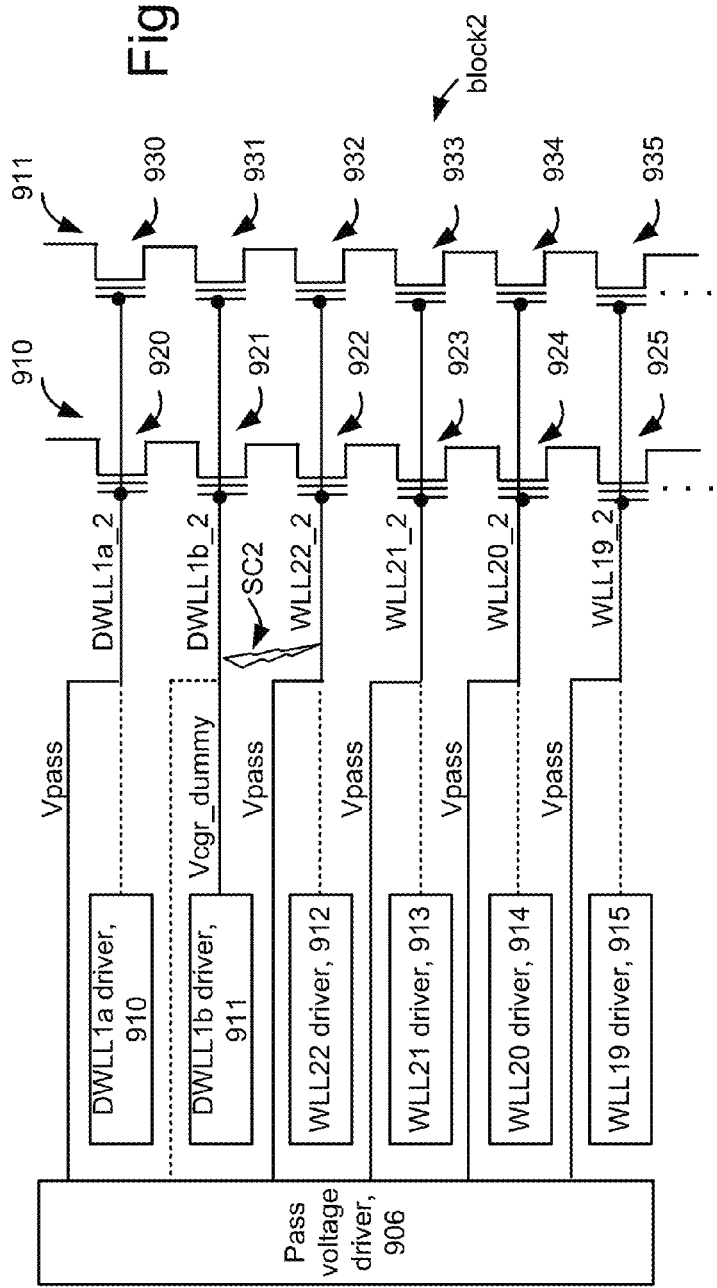

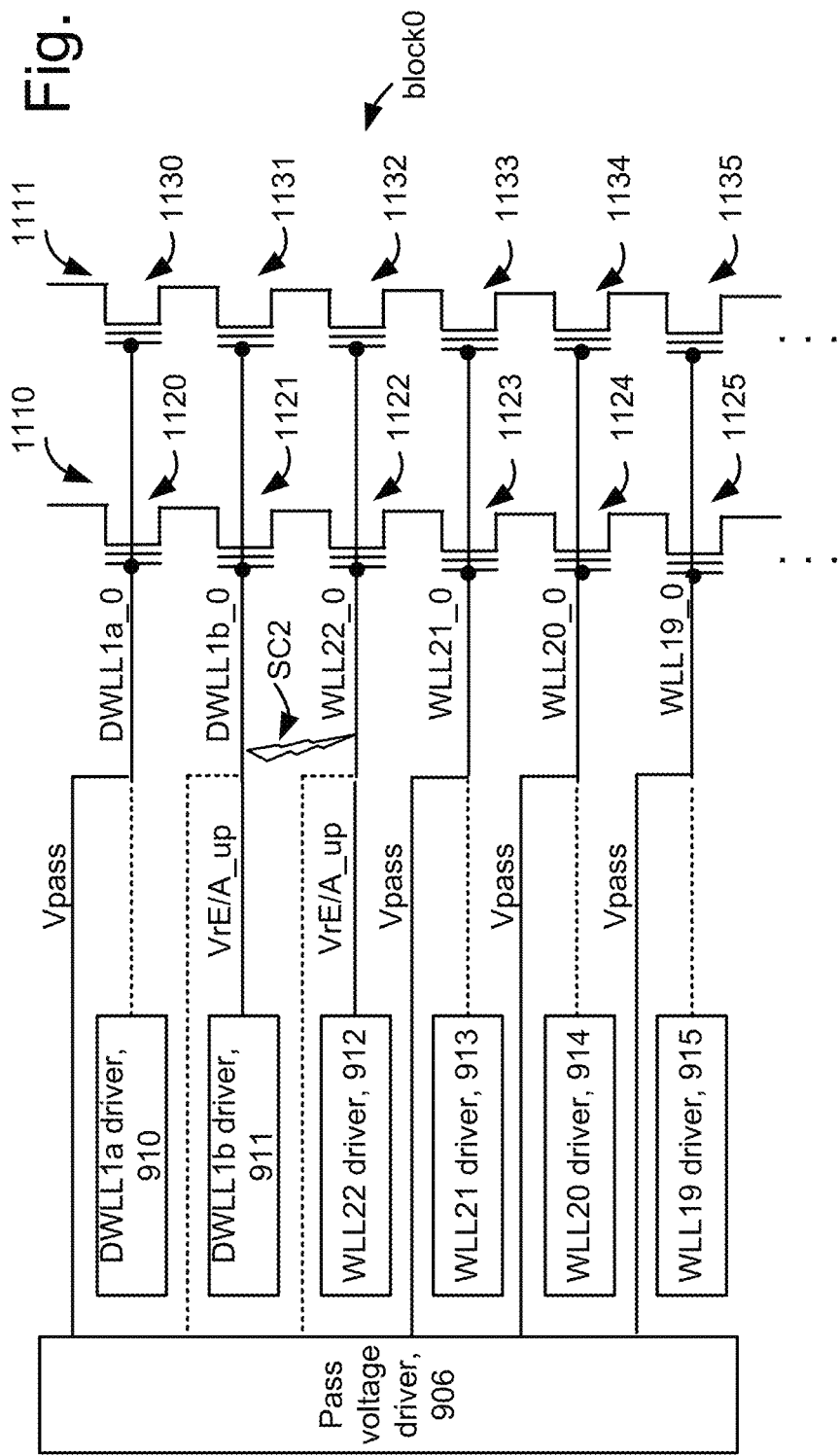

DATA RECOVERY IN A 3D MEMORY
DEVICE WITH A SHORT CIRCUIT
BETWEEN WORD LINES

BACKGROUND

The present technology relates to the operation of memory devices.

A charge-trapping material can be used in memory devices to store a charge which represents a data state. The charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

However, various challenges are presented in operating such memory devices.

BRIEF DESCRIPTION OF THE DRAWINGS

Like-numbered elements refer to common components in the different figures.

FIG. 1B is a functional block diagram of a memory device such as the 3D stacked non-volatile memory device 100 of FIG. 1A.

FIG. 1C depicts example code which may be executed by a processor (e.g., memory controller).

FIG. 3C1 depicts an embodiment of a stack 376 showing a cross-sectional view of the portion 307 of FIG. 3A, along line 305, where two SGD layers, two SGS layers and dummy word line layers DWLL1a, DWLL1b, DWLL2a and DWLL2b are provided.

FIG. 3C2 depicts a variation in the width of a memory hole along its height.

FIG. 4A depicts a view of the region 246 of FIG. 3C1, showing SGD transistors D1a (consistent with FIG. 3C1) and D1a1 above dummy memory cells DMC1a and DMC1b and a data memory cell MC.

FIG. 4B1 depicts a cross-section view of the region 246 of FIG. 4A along line 444.

FIG. 4B2 depicts a close-up view of the tunneling layer 404 of FIG. 4B1, showing an oxide 404a, nitride 404b, oxide 404c configuration.

FIG. 9A depicts a circuit diagram comprising example NAND strings 910 and 911 in a failure block (e.g., block2), showing an example of voltages which are consistent with step 611a of FIG. 6A.

FIG. 9B depicts a table of voltages consistent with FIG. 9A for a case 1 in which there is no short between WLn and WLn−1 and a case 2 in which there is a short between WLn and WLn−1.

FIG. 10A depicts a circuit diagram comprising the example NAND strings 910 and 911 of FIG. 9A, showing an example of voltages which are consistent with step 613a of FIG. 6A.

FIG. 10B depicts a table of voltages consistent with FIG. 10A for a case 3 in which there is no short between WLn and WLn+1 and a case 4 in which there is a short between WLn and WLn+1.

FIG. 11 depicts a circuit diagram comprising example NAND strings 1110 and 1111 in a non-failure block (e.g., block0), showing an example of voltages which are consistent with step 623 of FIG. 6B.

DETAILED DESCRIPTION

Techniques are provided for recovering data in a 3D stacked non-volatile memory device in which word line layers are shorted together.

A 3D stacked non-volatile memory device has a multi-layer configuration in which conductive layers alternate with dielectric layers in a stack. Memory holes are etched in the stack and films are deposited in the holes such that memory cells or select gate transistors are formed where the conductive layers intersect with the memory holes. The films can include a charge-trapping layer which extends vertically along an individual cell or an entire NAND string, a tunneling layer and a channel layer. Some of the conductive layers (e.g., word line layers) are used as control gates for memory cells and other conductive layers are used as control gates for select gate transistors, such as drain or source side transistors in NAND strings. The NAND strings extend vertically in the memory device. The charge-trapping material can be silicon nitride or other nitride, or have oxide-nitride-oxide (O—N—O) configuration. The memory cells can include data memory cells, which are eligible to store data, and dummy memory cells, which are not eligible to store data, but provide a transition region between a select gate and the data memory cells.

At the time of manufacture, in the die sort process, the memory device is tested to detect defects such as short circuits. However, some defects can occur when the memory device is in the hands of the end user. For example, short circuits between word line layers may occur after a few program-erase cycles. Such defects can result in data loss.

Techniques provided herein can detect the presence of a short circuit involving a word line layer and attempt to recover data from memory cells connected to the word line layer. In one approach, the memory device comprises blocks of memory cells in which each block has a separate stack of word line layers but the word line layers at a common height in the different stacks are connected. A process to detect a short circuit is initiated when an nth word line layer (WLn) in an ith block fails to successfully complete programming within a maximum allowable number of program loops. A determination is made as to whether WLn is shorted to WLn−1 and/or WLn+1. If WLn is shorted to WLn+1 but not WLn−1 in the ith block, a recovery read process is performed to read the data which has been programmed into the memory cells of WLn of the previously-programmed blocks. The recovery read process uses upshifted control gate read voltages due to a change in an amount of capacitive coupling from an adjacent word line layer resulting from the short circuit. The recovered data can be written to another block. This avoids the need for the host to resend the data which had already been programmed, and can avoid data loss.

The following discussion provides details of the construction of example memory devices and of related techniques which address the above and other issues.

Figure 1A:
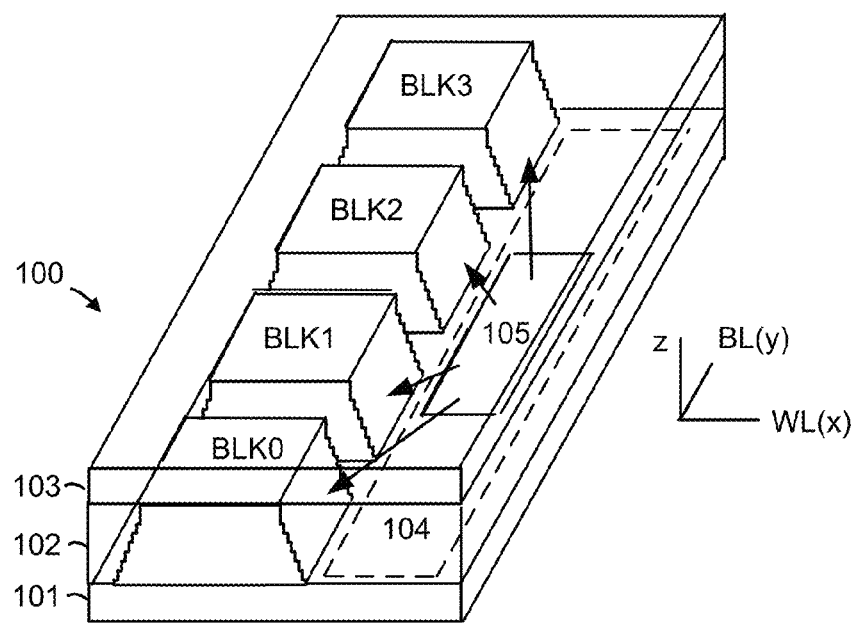
FIG. 1A is a perspective view of a set of blocks in a 3D stacked non-volatile memory device.

FIG. 1A is a perspective view of a set of blocks in a 3D stacked non-volatile memory device. The memory device 100 includes a substrate 101. On the substrate are example blocks BLK0, BLK1, BLK2 and BLK3 of memory cells (storage elements) and a peripheral area 104 with circuitry for use by the blocks. For example, the circuitry can include voltage drivers 105 which can be connected to control gate layers of the blocks. In one approach, control gate layers at a common height in the blocks are commonly driven. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths (see FIG. 5A). While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

FIG. 1B is a functional block diagram of a memory device such as the 3D stacked non-volatile memory device 100 of FIG. 1A. The memory device 100 may include one or more memory die 108. The set of blocks of FIG. 1A can be on one die. The memory die 108 includes a memory structure 126 of memory cells, such as an array of memory cells, control circuitry 110, and read/write circuits 128. In a 3D configuration, the memory structure can include the blocks of FIG. 1A. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120 and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided for parameters for data recovery techniques as described herein. For example, the parameters can include read voltages for detecting short circuits and read voltages for recovery operations (see FIG. 8A to 8C).

The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SB1, SB2, . . . , SBp, read/write circuits 128, controller 122, and so forth.

The off-chip controller 122 may comprise a processor 122c and storage devices (memory) such as ROM 122a and RAM 122b. The storage devices comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, FIG. 1C depicts example code which may be executed by the processor 122c. The code 150 is used by the controller to access the memory structure such as for programming, read and erase operations. The code can include boot code 151 and control code (set of instructions) 160. The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The set of instructions can include instructions to detect a failure in an attempt to program data into memory cells of a word line layer WLn in a block (161), instructions to determine that WLn is shorted to WLn+1 but not WLn−1 (162), instructions to read data from memory cells in WLn in previously-programmed blocks using upshifted control gate read voltages (163) and instructions to program the recovered data to another set of blocks (164).

Figure 6A:
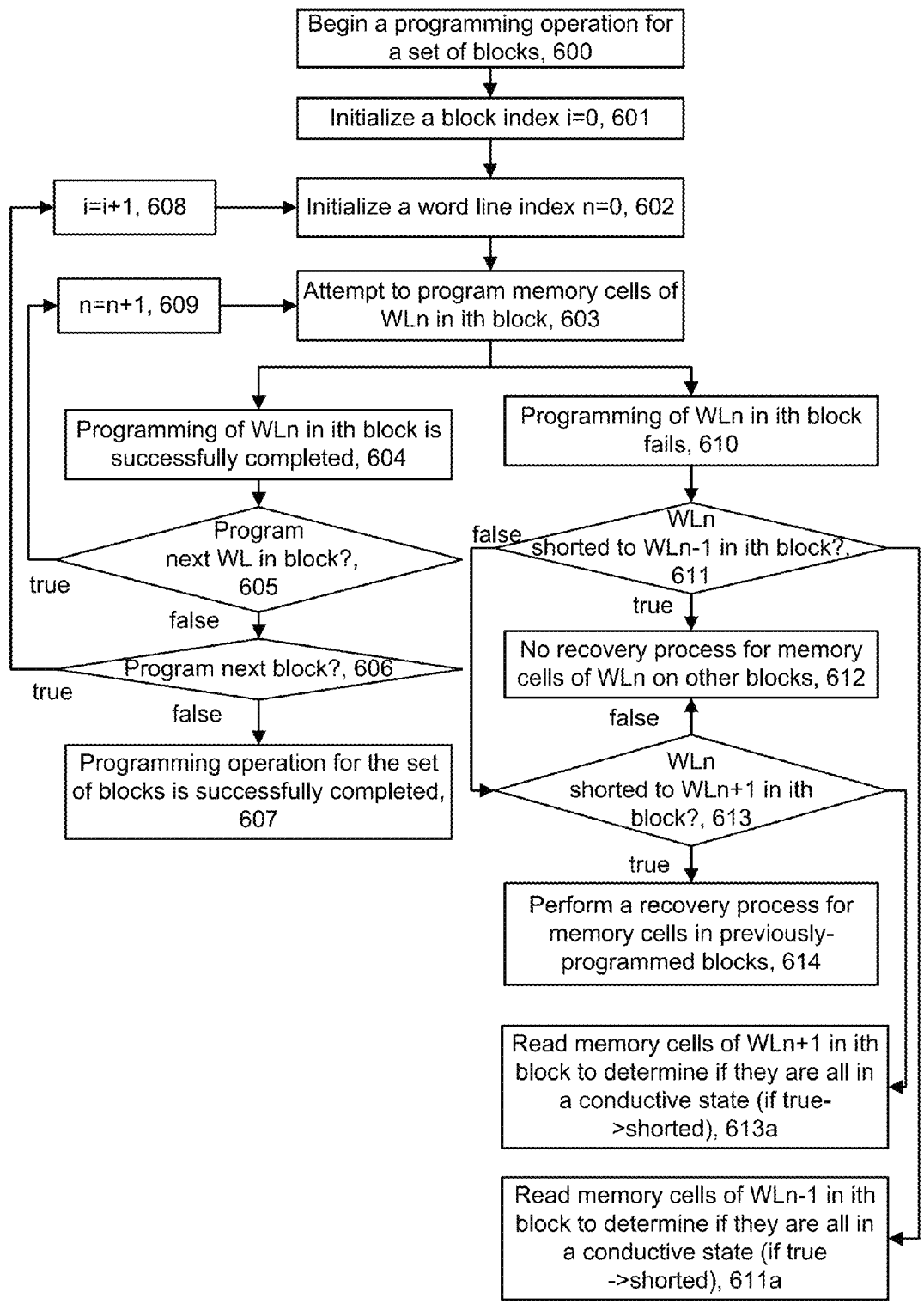
FIG. 6A depicts an example programming operation in which a short circuit between word lines is detected.
Figure 6B:
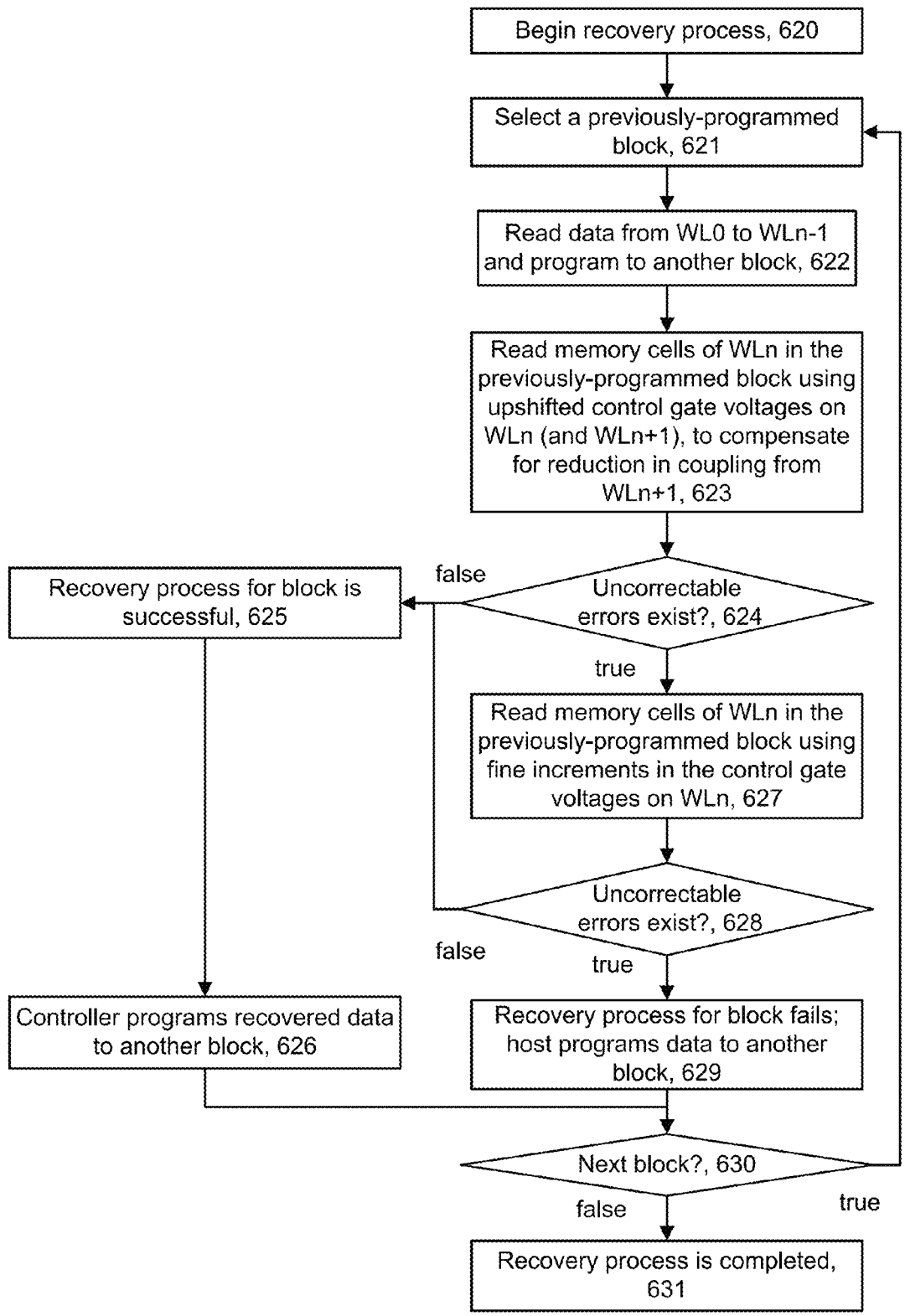
FIG. 6B depicts an example recovery process consistent with step 614 of FIG. 6A.

Generally, the control code can include instructions to perform the functions described herein including the steps of the processes of FIGS. 6A and 6B.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figures 2A, 2B:
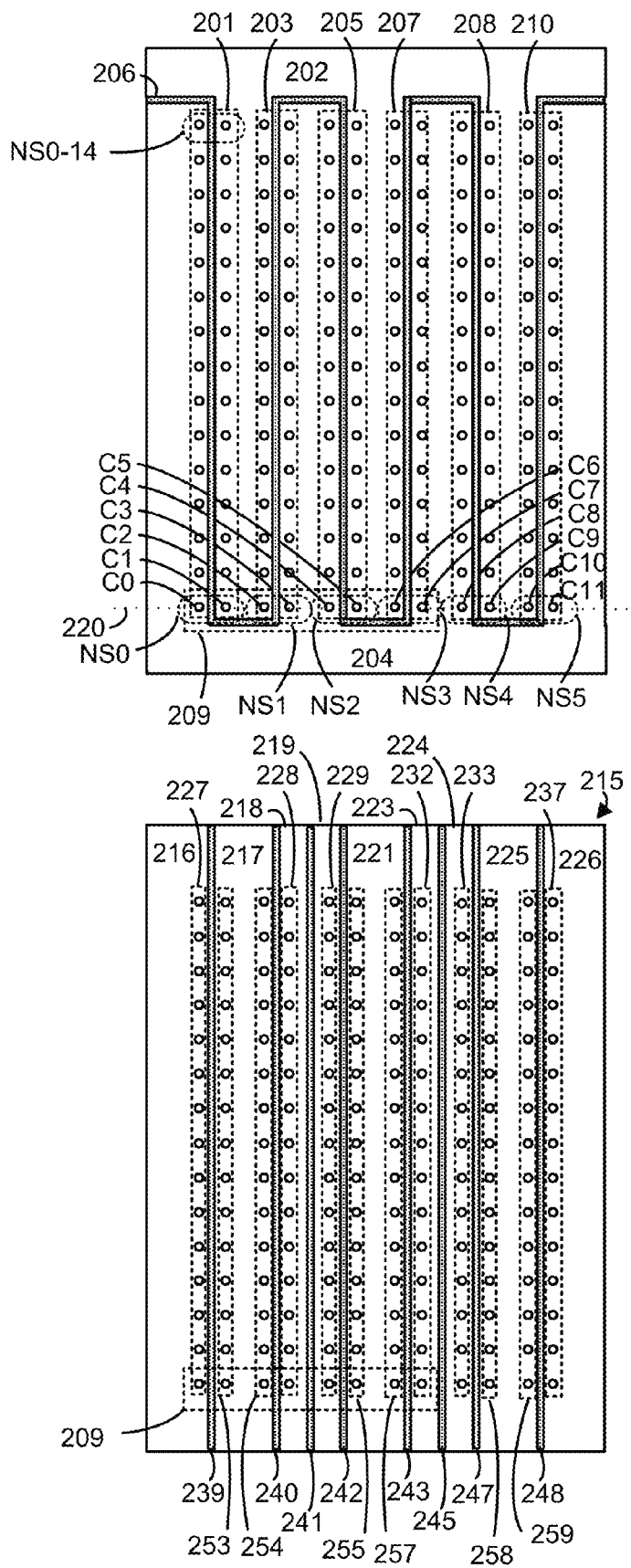
FIG. 2A depicts a top view of example word line layers 202 and 204 in a U-shaped NAND embodiment, as an example implementation of BLK0 in FIG. 1A.
FIG. 2B depicts a top view of example select gate layer portions, consistent with FIG. 2A.

FIG. 2A depicts a top view of example word line layers 202 and 204 in a U-shaped NAND embodiment, as an example implementation of BLK0 in FIG. 1A. In a 3D stacked memory device, memory cells are formed along memory holes which extend through alternating conductive and dielectric layers in a stack. The memory cells are typically arranged in NAND strings. Each conductive layer can include one or more word line layers. A word line layer is an example of a word line.

Figure 2C:
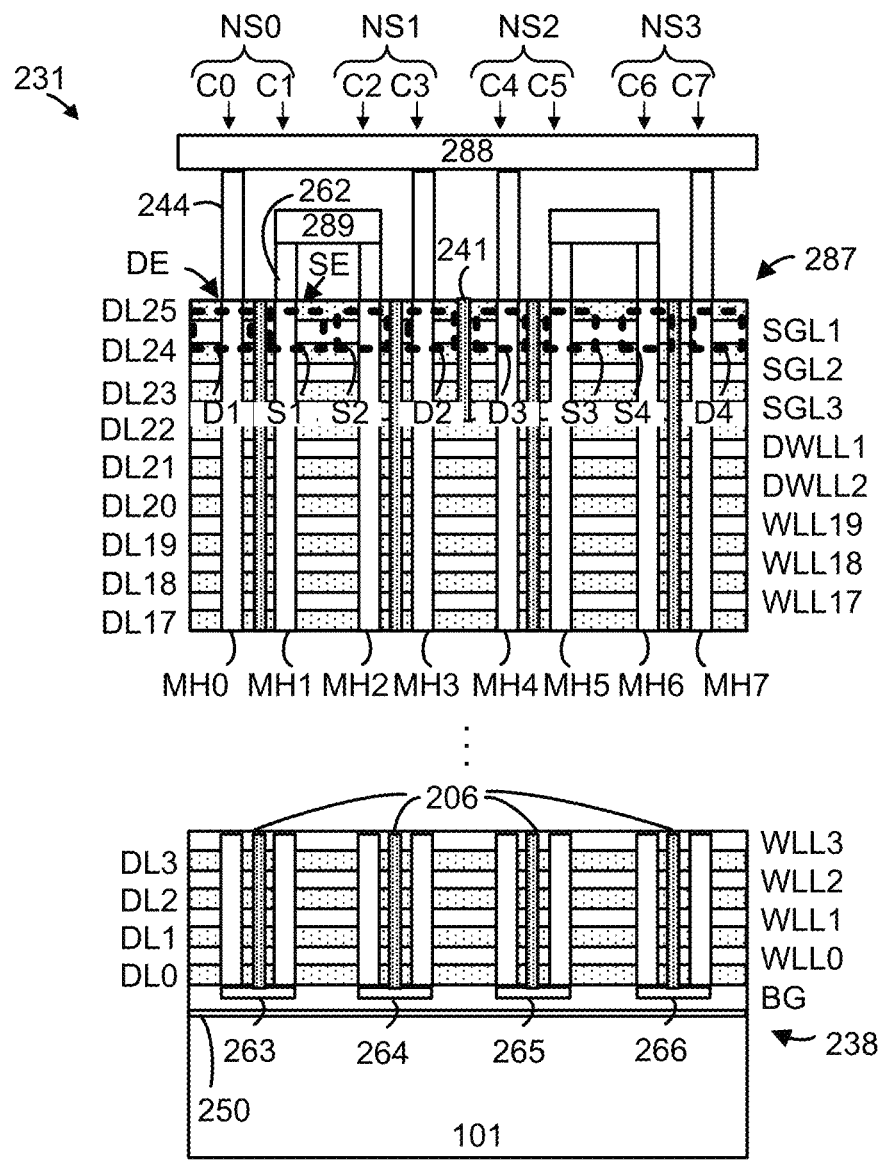
FIG. 2C depicts an embodiment of a stack 231 showing a cross-sectional view of the portion 209 of FIG. 2A, along line 220, where three select gate layers, SGL1, SGL2 and SGL3 are provided.

The view is of a representative layer among the multiple WLLs in a stack. Referring also to FIG. 2C, the stack includes alternating dielectric and conductive layers. The dielectric layers include DL0 to DL25 and may be made of SiO2, for instance. The conductive layers include a back gate layer (BGL), data word line layers WLL0 to WLL19, dummy word line layers DWLL1 and DWLL2, and select gate layers SGL1, SGL2 and SGL3. The word line layers are conductive paths to control gates of the memory cells at the layer. Moreover, each select gate layer may comprises conductive lines to select gate transistors (e.g., SGD and/or SGS transistors).

As mentioned, a dummy memory cell, also referred to as a non-data memory cell, does not store data, while a data memory cell is eligible to store data. Thus, data memory cells may be programmed to store write data. After a block is erased, all data memory cells are in the erased state. As some word lines are programmed, the corresponding data memory cells store data while other data memory cells do not store data. As a remainder of the block is programmed, all data memory cells typically store data.

The word line layers of FIG. 2A may represent any one of the word line layers in FIG. 2C. These conductive layers may include doped polysilicon, metal such as tungsten or metal silicide, for instance. An example voltage of 5-10 V may be applied to the back gate to maintain a conductive state which connects the drain- and source-side columns.

For each block, each conductive layer may be divided into two word line layers 202 and 204 which are insulated from one another by a slit 206. The slit is formed by etching a void which extends vertically in the stack, typically from an etch stop layer at the bottom to at least a top layer of the stack, then filling the slit with insulation. This is an example of the type of etching which can result in the accumulation of charges in the top conductive layer of the stack. The slit 206 is a single continuous slit which extends in a zig-zag pattern in the block. This approach can provide greater flexibility in controlling the memory cells since the WLLs can be driven independently.

Each block includes vertically-extending memory holes or pillars which extend vertically in the stack, and comprise a column of memory cells such as in a NAND string. Each circle represents a memory hole or a memory cell associated with the word line layer. Example columns of memory cells along a line 220 include C0 to C11. Columns C0, C3, C4, C7, C8 and C11 represent the drain side columns of respective NAND strings. Columns C1, C2, C5, C6, C9 and C10 represent the source side columns of respective NAND strings. The figure represents a simplification, as many more rows of memory holes will typically be used, extending to the right and left in the figure. Also, the figures are not necessarily to scale. The columns of memory cells can be arranged in subsets such as sub-blocks.

Further, the NAND strings are arranged in sets, where each NAND string in a set has an SGD transistor with a common control gate voltage. See also FIG. 2B. Regions 201, 203, 205, 207, 208 and 210 each represent a set of NAND strings, or a set of memory cells in a word line layer. For example, region 210 includes NAND strings NS0, . . . , NS0-14. A programming operation can involve one set of NAND strings. Each NAND string in a set can be associated with a respective bit line which is independently controlled to allow or inhibit programming.

The drawings are not to scale and do not show all memory columns. For example, a more realistic block might have twelve memory columns in the y direction as shown, but a very large number such as 32 k memory columns in the x direction, for a total of 384,000 memory columns in a block. With U-shaped NAND strings, 192 k NAND strings are provided in this example. With straight NAND strings, 384,000 NAND strings are provided in this example. Assuming there are twenty-four memory cells per column, there are 384,000× 24=9,216,000 memory cells in the set.

FIG. 2B depicts a top view of example select gate layer portions, consistent with FIG. 2A. In one approach, the select gate layer 215 is different than a WLL in that a separate SGD layer portion or line, is provided for each set of NAND strings. That is, each single row of SGD transistors extending in the x direction is separately controlled. In other words, the control gates of the SGD transistors in each set of NAND strings are commonly controlled.

Further, an SGS layer portion or line is provided for a pair of rows of SGS transistors extending in the x direction, in one approach, for adjacent sets of NAND strings. Optionally, additional slits are used so that a separate SGS layer portion is provided for a single row of SGS transistors extending in the x direction. Thus, the control gates of the SGS transistors in a pair of rows of SGS transistors, or in a single row of SGS transistors, are also commonly controlled.

The SGS and SGD layer portions are created due to slits 239, 240, 241, 242, 243, 245, 247 and 248. The slits extend partway down in the stack as depicted by example slit 241 in FIG. 2C. Regions 227, 228, 229, 232, 233 and 237 represent SGD transistors in SGD lines 216, 218, 219, 223, 224 and 226, respectively. Regions 253 and 254, 255 and 257, and 258 and 259 represent SGS transistors in SGS lines 217, 221 and 225, respectively. Regions 255 and 257, 258 and 259, represent SGS transistors in SGS layer portions 221 and 225, respectively. The portion 209 from FIG. 2A is repeated for reference.

The select gate transistors are associated with NAND strings NS0-NS5.

FIG. 2C depicts an embodiment of a stack 231 showing a cross-sectional view of the portion 209 of FIG. 2A, along line 220, where three select gate layers, SGL1, SGL2 and SGL3 are provided. In this case, the slit extends down to DL22, so that three separate layers of select gate transistors are formed in each column of each NAND string. The stack has a top 287 and a bottom 238.

The conductive layers of the select gates can have a same height (channel length) as the conductive layers of the memory cells, in one approach. This facilitates the fabrication of the memory device. In a column, the individual select gate transistors together are equivalent to one select gate transistor having a channel length which is the sum of the channel lengths of the individual select gate transistors. Further, in one approach, select gate transistors in a column (e.g., in layers SGL1, SGL2 and SGL3) are connected and received a common voltage during operations. The SGS transistors can have a similar construction as the SGD transistors. Further, the SGS and SGD transistors can have a similar construction as the memory cell transistors.

The substrate may be p-type and can provide a ground which is connected to the top select gate layer, in one approach. A via 244 connects a drain side of C0 and NS0 to a bit line 288. A via 262 connects a source side of C1 and NS0 to a source line 289. Back gates 263, 264, 265 and 266 are provided in NS0, NS1, NS2 and NS3, respectively.

Regions D1, D2, D3 and D4 represent SGD transistors and regions S1, S2, S3 and S4 represent SGS transistors in SGL1.

Figure 2D:
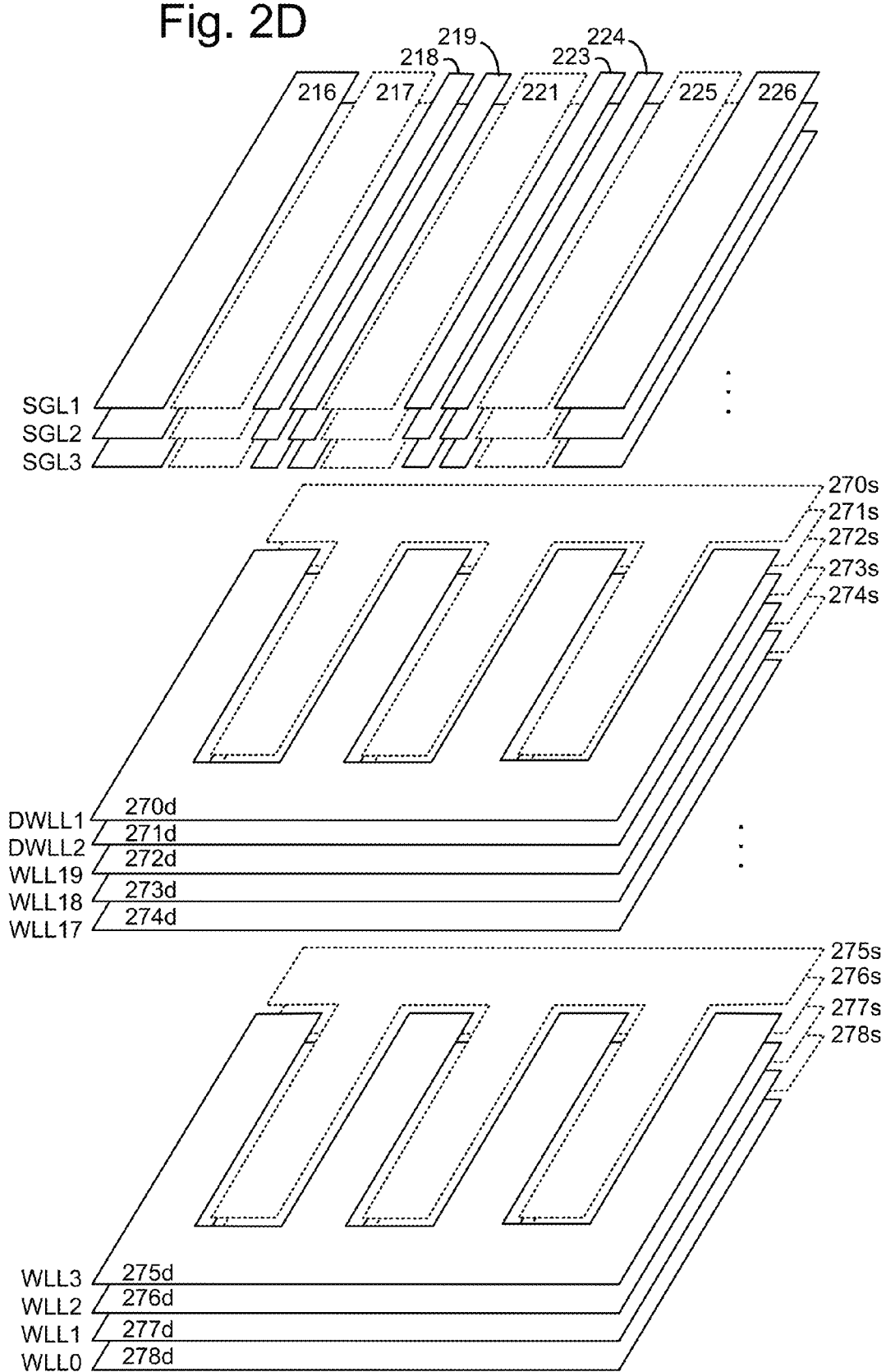
FIG. 2D depicts an alternative view of the select gate layers and word line layers of the stack 231 of FIG. 2C.

FIG. 2D depicts an alternative view of the select gate layers and word line layers of the stack 231 of FIG. 2C. The SGL layers SGL1, SGL2 and SGL3 each includes parallel rows of select gate lines associated with the drain-side (shown by solid lines) or source-side (shown by dotted lines) of a set of NAND strings. For example, SGL1 includes drain-side select gate lines 216, 218, 219, 223, 224 and 226 and source-side select gate lines 217, 221 and 225, consistent with FIG. 2B. Each select gate line can be independently controlled, in one approach.

Below, the SGL layers are the word line layers. Each word line layer includes a drain-side word line connected to memory cells on a drain-side of a NAND string (the half of a NAND string between the back gate and the drain end) and a source-side word line connected to memory cells on a source-side of a NAND string (the half of a NAND string between the back gate and the source end). For example, DWLL1, DWLL2, WLL19, WLL18 and WLL17 include drain-side word lines 270d, 271d, 272d, 273d and 274d, respectively, and source-side word lines 270s, 271s, 272s, 273s and 274s, respectively.

WLL3, WLL2, WLL1 and WLL0 include drain-side word lines 275d, 276d, 277d and 278d, respectively, and source-side word lines 275s, 276s, 277s and 278s, respectively. Each word line can be controlled independently, in one approach.

In an example programming operation, the source-side word line 272s is a first programmed word line and a drain-side word line 272d is a final programmed word line in a block.

Figure 3A:
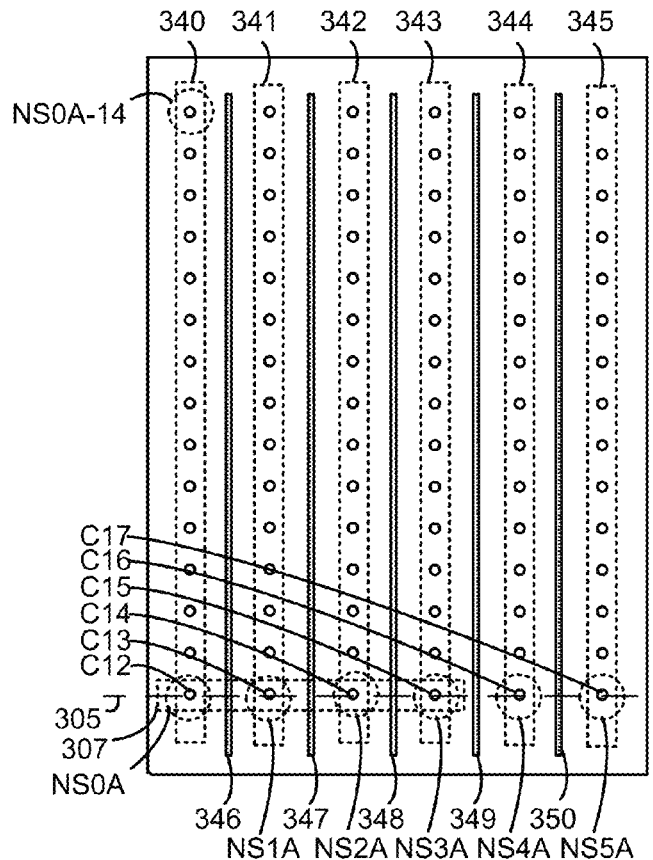
FIG. 3A depicts a top view of an example word line layer 304 of the block BLK0 of FIG. 1A, in a straight NAND string embodiment.

FIG. 3A depicts a top view of an example word line layer 304 of the block BLK0 of FIG. 1A, in a straight NAND string embodiment. In this configuration, a NAND string has only one column, and the source-side select gate is on the bottom of the column instead of on the top, as in a U-shaped NAND string. Moreover, a given level of a block has one WLL which is connected to each of the memory cells of the layer. Insulation-filled slits 346, 347, 348, 349 and 350 can also be used in the fabrication process to provide structural support for the stack when undoped polysilicon layers are removed by a wet etch and a dielectric is deposited to form the alternating dielectric layers. A dashed line 305 extends through columns C12-C17. A cross-sectional view along line 305 of portion 307 is shown in FIG. 3C1.

Regions 340, 341, 342, 343, 344 and 345 represent the memory cells (as circles) of respective sets of NAND strings. For example, region 340 represents memory cells in NAND strings NS0A, NS0A-14. Additional NAND strings include NS1A, NS2A, NS3A, NS4A and NS5A. A programming operation for a block can involve programming one set of NAND strings at a time, one word line layer at a time. For example, the memory cells of the NAND string set of region 340 may be programmed first, followed by the memory cells of the NAND string set of region 341, and so forth. See also FIG. 5B. Similarly, a read operation for a block can involve sensing one set of NAND strings at a time, while a control gate voltage is applied to a selected word line layer and pass voltages are applied to remaining word line layers.

Alternatively, the layer 304 represents an SGS layer, in which case each circle represents an SGS transistor.

Figure 3B:
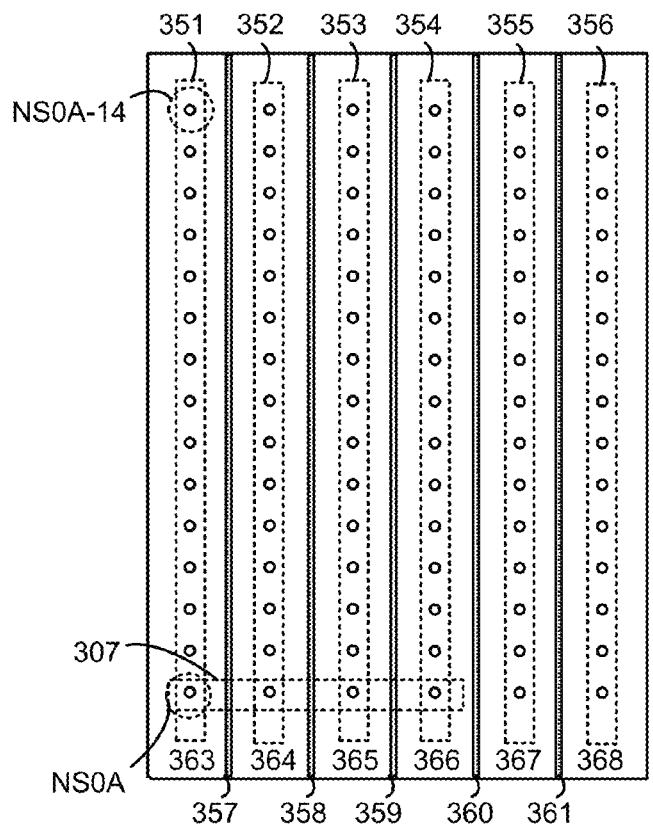
FIG. 3B depicts a top view of an example SGD layer 362, consistent with FIG. 3A.

FIG. 3B depicts a top view of an example SGD layer 362, consistent with FIG. 3A. Slits 357, 358, 359, 360 and 361 divide the SGD layer into portions 363, 364, 365, 366, 367 and 368. Each portion connects the SGD transistors in a set of NAND strings. For example, SGD layer portion 363 or line connects the SGD transistors in the set of NAND strings NS0A to NS0A-14. Regions 351, 352, 353, 354, 355 and 356 represent the SGD transistors (as circles) of respective sets of NAND strings in the SGD layer portions 363, 364, 365, 366, 367 and 368, respectively. The portion 307 from FIG. 3A is also repeated. The select gate transistors are associated with NAND strings NS0A-NS5A.

FIG. 3C1 depicts an embodiment of a stack 376 showing a cross-sectional view of the portion 307 of FIG. 3A, along line 305, where two SGD layers, two SGS layers and four dummy word line layers DWLL1a, DWLL1b, DWLL2a and DWLL2b are provided. Columns of memory cells corresponding to NAND strings NS0A-NS3A are depicted in the multi-layer stack. The stack includes a substrate 101, an insulating film 250 on the substrate, and a portion of a source line SL0A. Additional straight NAND strings in a SGD line subset extend behind the NAND strings depicted in the cross-section, e.g., along the x-axis. NS0A has a source end SEa and a drain end DEa. The slits 346, 347 and 348 from FIG. 3A are also depicted. A portion of the bit line BL0A is also depicted. A conductive via 373 connects DEa to BL0A. The columns are formed in memory holes MH0-MH4. The memory holes are columnar and extend at least from a top 370 to a bottom 371 of the stack.

The source line SL0A is connected to the source ends of each NAND string. SL0A is also connected to other sets of memory strings which are behind these NAND strings in the x direction.

Word line layers, e.g., WLL0-WLL23, and dielectric layers, e.g., DL0-DL24, are arranged alternatingly in the stack. SGS transistors 369, 372, 374 and 375 are formed in the SGS1 layer.

A region 246 of the stack is shown in greater detail in FIG. 4A. Regions D1a, D2a, D3a and D4a represent SGD transistors.

FIG. 3C2 depicts a variation in the width of a memory hole along its height. Due to the etching process used to create the memory holes, the cross-sectional width, e.g., diameter, of the memory hole can vary along its height. This is due to the very high aspect ratio. For example, a depth-to-diameter ratio of about 25-30 is common. Typically, the diameter becomes progressively smaller from the top to the bottom of the memory hole. In some case, a slight narrowing occurs at the top of the hole, as depicted, so that the diameter becomes slight wider before becoming progressively smaller from the top to the bottom of the memory hole.

Due to the non-uniformity in the width of the memory hole, and the width of the vertical pillar which is formed in the memory hole, the programming and erase speed of the memory cells can vary based on their position along the memory hole. With a smaller diameter memory hole, the electric field across the tunneling layer is stronger, so that the programming and erase speed is higher.

In this case, the memory cells are arranged along vertically-extending memory holes (MH0-MH7) in the memory device, and a width of the vertically-extending memory holes varies along a height of the memory device.

Figure 3D:
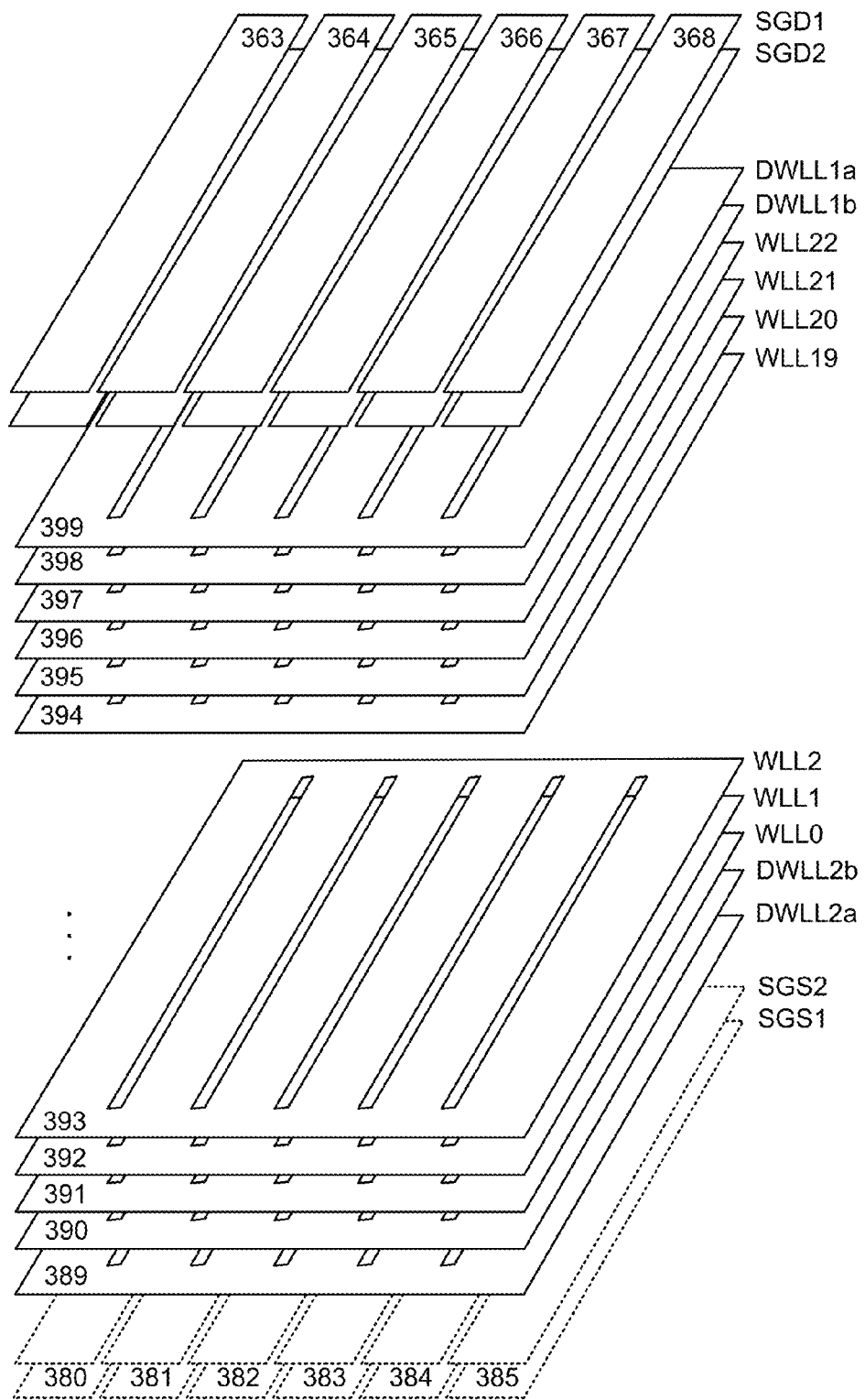
FIG. 3D depicts an alternative view of the select gate layers and word line layers of the stack 376 of FIG. 3C.

FIG. 3D depicts an alternative view of the select gate layers and word line layers of the stack 376 of FIG. 3C. The SGD layers SGD1 and SGD2 each includes parallel rows of select gate lines associated with the drain-side of a set of NAND strings. For example, SGD1 includes drain-side select gate lines 363, 364, 365, 366, 367 and 368, consistent with FIG. 3B. Each select gate line can be independently controlled, in one approach.

Below the SGD layers are the word line layers. Each word line layer represents a word line, in one approach, and is connected to a set of memory cells at a given height in the stack. For example, DWLL1a, DWLL1b, WLL22, WLL21, WLL20 and WLL19 represent word lines 399, 398, 397, 396, 395 and 394, respectively. WLL2, WLL1, WLL0, DWLL2b and DWLL2a represent word lines 393, 392, 391, 390 and 389, respectively. Each word line can be controlled independently, in one approach.

Below the word line layers are the SGS layers. The SGS layers SGS1 and SGS2 each includes parallel rows of select gate lines associated with the source-side of a set of NAND strings. For example, SGS1 includes source-side select gate lines 380, 381, 382, 383, 384 and 385. Each select gate line can be independently controlled, in one approach.

In an example programming operation, the source-side word line 391 is a first programmed word line and a drain-side word line 397 is a final programmed word line in a block.

FIG. 4A depicts a view of the region 246 of FIG. 3C1, showing SGD transistors D1a (consistent with FIG. 3C1) and D1a1 above dummy memory cells DMC1a and DMC1b and a data memory cell MC. A number of layers can be deposited along the sidewalls of the column and within each word line layer. These layers can include oxide-nitride-oxide (O—N—O) and polysilicon layers which are deposited, e.g., using atomic layer deposition. For example, the column includes a charge-trapping layer or film (CTL) 403 such as SiN or other nitride, a tunneling layer (TL) 404, a polysilicon body or channel (CH) 405, and a dielectric core (DC) 406. A word line layer includes a block oxide (BOx) 402, a block high-k material 401, a barrier metal 400, and a conductive metal such as W 399 as a control gate. For example, control gates CG1a, CG1a1, CG1a2, CG1a3 and CG1a4 are provided for the SGD transistors D1a and D1a1, the dummy memory cell DMC1a and DMC1b, and the memory cell MC, respectively. In another approach, all of these layers except the metal are provided in the column. Additional memory cells are similarly formed throughout the columns. The layers in the memory hole form a columnar active area (AA) of the NAND string.

When a memory cell is programmed, electrons are stored in a portion of the CTL which is associated with the memory cell. These electrons are drawn into the CTL from the channel, and through the tunneling layer (TL). The Vth of a memory cell is increased in proportion to the amount of stored charge. During an erase operation, the electrons return to the channel.

Each of the memory holes can be filled with a plurality of annular layers comprising a block oxide layer, a charge trapping layer, a tunneling layer and a channel layer. A core region of each of the memory holes is filled with a body material, and the plurality of annular layers are between the core region and the WLLs in each of the memory holes.

FIG. 4B1 depicts a cross-section view of the region 246 of FIG. 4A along line 444. Each layer is ring-shaped in one possible approach, except the core filler, which is a cylinder.

FIG. 4B2 depicts a close-up view of the tunneling layer 404 of FIG. 4B1, showing an oxide 404a, nitride 404b, oxide 404c configuration.

Figure 5A:
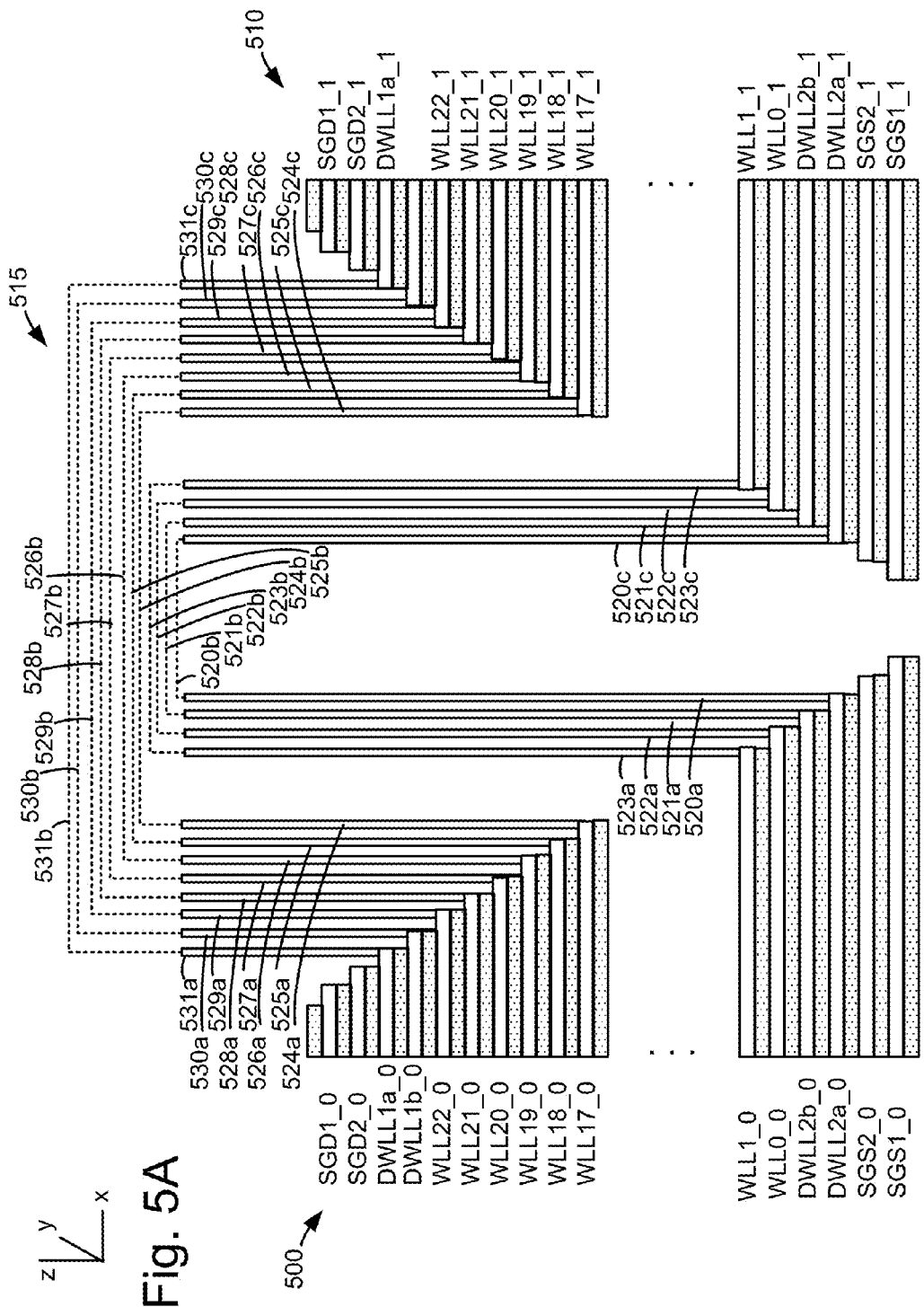
FIG. 5A depicts an interconnect structure between word line layers of adjacent blocks.

FIG. 5A depicts an interconnect structure 515 between word line layers of adjacent blocks. As mentioned, a plurality of word line layers alternate with dielectric layers in a stack of layers in each block. Moreover, the blocks in a memory device can have their word line layers connected by the interconnect structure. This allows common voltage drivers to be used for the set of blocks. Additionally, other interconnect structures can be provided in gaps between the blocks, such as to connect circuitry below the stacks to metal lines above the stack. In one approach, the layers in each block (e.g., stack) have an increasing width toward the bottom so that a terrace structure is formed at the edge of each block. Vias are formed which rest on each word line layer at the terrace structure and extend upward to a metal layer. Horizontal paths in the metal layer may be used to connect the vias of one terrace structure to vias of an adjacent terrace structure. In particular, corresponding word line layers at a common height in the memory device can be electrically connected.

For example, block0 has conductive layers (identified by the suffix "_0") in a terrace structure 500, and block1 has conductive layers (identified by the suffix "_1") in a terrace structure 510, consistent with the layers of FIGS. 3C1 and 3D. Specifically, block0 has conductive layers SGS1_0, SGS2_0, DWLL2a_0, DWLL2b_0, WLL0_0, WLL1_0, . . . , WLL17_0, WLL18_0, WLL19_0, WLL20_0, WLL21_0, WLL22_0, DWLL1b_0, DWLL1a_0, SGD2_0 and SGD1_0. Block1 has conductive layers SGS1_1, GS2_1, DWLL2_a1, DWLL2b_1, WLL0_1, WLL1_1, . . . , WLL17_1, WLL18_1, WLL19_1, WLL20_1, WLL21_1, WLL22_1, DWLL1b_1, DWLL1a_1, SGD2_1 and SGD1_1. The respective conductive layers are electrically connected by vias 520a-531a, horizontal paths 520b-531b and vias 520c-531c, respectively. The vias may be staggered along the y-axis, in one approach.

Figure 5B:
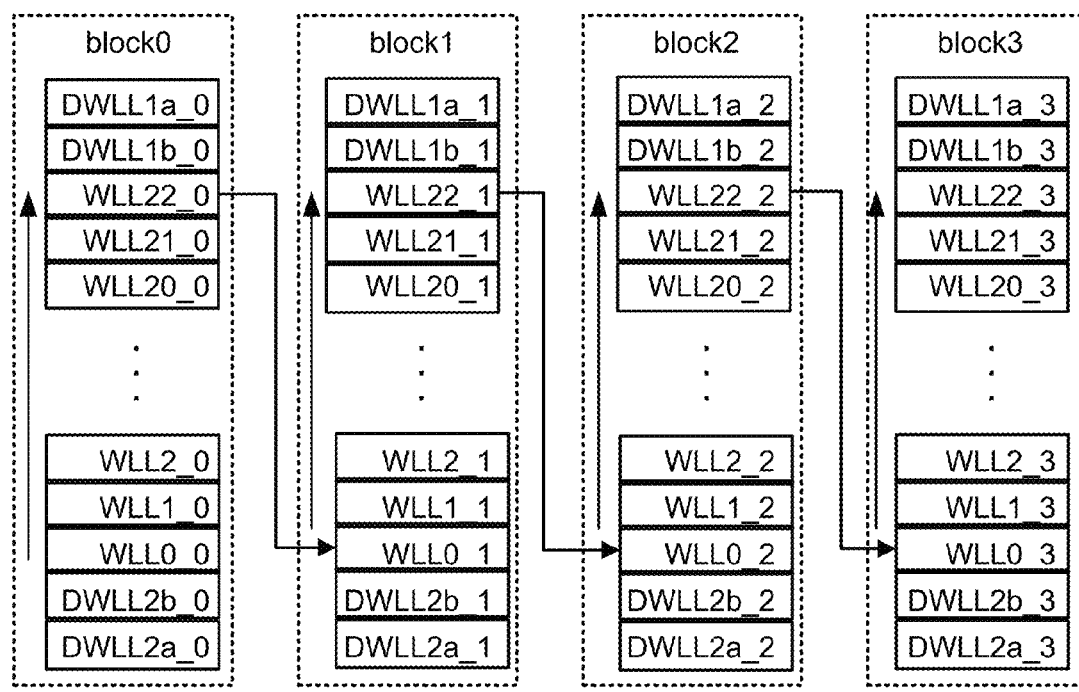
FIG. 5B depicts a programming order for a set of blocks such as in FIG. 1A.

FIG. 5B depicts a programming order for a set of blocks such as in FIG. 1A. As mentioned, typically a block of memory cells is programmed in a word line order, starting from a lowest data word line (e.g., at the source end of a NAND string, which can be straight or U-shaped, for instance) in the block and proceeding one word line at a time to a top data word line layer (e.g., at the drain end of the NAND string). Subsequently, a next block can be programmed, and so forth. For example, block0 is programmed in the word line order of WLL1_0 to WLL22_0, then block1 is programmed in the word line order of WLL1_1 to WLL22_1, then block2 is programmed in the word line order of WLL1_2 to WLL22_2, and then block3 is programmed in the word line order of WLL1_3 to WLL22_3. This process is followed as long as the programming of each word line is successfully completed. If a programming failure occurs for a particular word line in a particular block, it is possible to recover data from previously-programmed word lines, including word lines which are at the same height in the memory device as the particular word line. The dummy word line layers are also depicted for reference.

Each word line layer in a block corresponds to another word line layer at a common height in the memory device. For example, DWLL1a_0, DWLL1a_1, DWLL1a_2 and DWLL1a_3 are corresponding, DWLL1b_0, DWLL1b_1, DWLL1b_2 and DWLL1b_3 are corresponding, WLL22_0, WLL22_1, WLL22_2 and WLL22_3 are corresponding, and so forth. WLL22_0, WLL22_1, WLL22_2 and WLL22_3 are topmost data word line layers in their respective blocks.

Figure 5C:
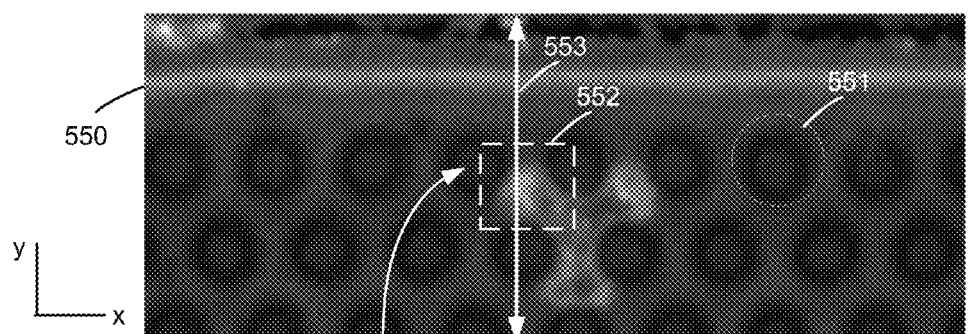
FIG. 5C depicts a top view of a memory device showing one example of a short circuit between word lines.

FIG. 5C depicts a top view of a memory device showing one example of a short circuit between word lines. As mentioned, short circuit paths can be formed during the operation of a memory device. One failure mode involves a short circuit between two or more adjacent word line layers. Typically, a data word line layer is shorted to one or more word line layers above it. The short circuit is believed to be initially formed as a "soft" short circuit during the manufacturing process which becomes a "hard" short circuit during the operation of the memory device, as the "soft" short circuit paths are stressed by the application of a programming voltage. This image shows a number of memory holes which appear as circles, such as an example memory hole 551. A slit region 550 provides a gap between groups of memory holes in a word line layer. The slit is used during manufacturing to deposit the conductive material which forms the line layers. The gap may extend between walls of the conductive material. A three-spoke white region represents a short circuit. One portion 552 corresponds to a region 554 in FIG. 5D. The short circuit may be caused by a reaction between oxide, tungsten and fluoride during heating, where tungsten is deposited as the conductive material. The short circuits have been seen in the higher word lines in a stack in sets of three adjacent word line layers, such as the top data word line layer and two dummy word line layers above it, or the top two data word line layers and one dummy word line layer above it. However, a short circuit could be between any two or more adjacent control gate layers, including word line layers of dummy and data memory cells and control gate layers for select gates.

Figure 5D:
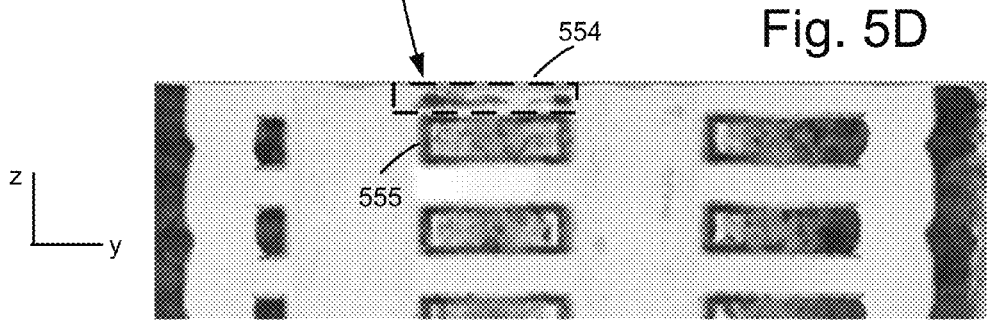
FIG. 5D depicts a cross-sectional view of the memory device of FIG. 5C along the arrow 553.

FIG. 5D depicts a cross-sectional view of the memory device of FIG. 5C along the arrow 553. In this view, the dark rectangular regions are portions of word line layers, while the lighter regions represent oxide or memory holes. The region 554 represents the conductive material (e.g., Tungsten) forming a conductive path (short circuit) between the word line layer portion 555 and a word line layer portion in a next-higher layer (not shown).

Figure 5E:
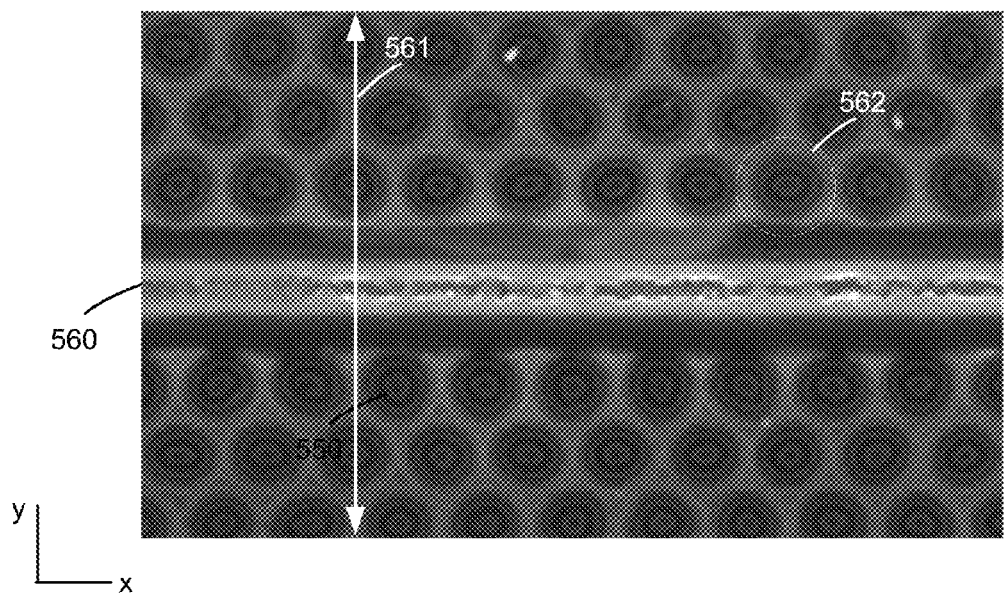
FIG. 5E depicts a top view of a memory device showing another example of a short circuit between word lines.

FIG. 5E depicts a top view of a memory device showing another example of a short circuit between word lines. This image shows a number of memory holes which appear as circles, such as an example memory hole 562. A slit region 560 provides a gap between groups of memory holes in a word line layer. The short circuit is not visible in this view.

Figure 5F:
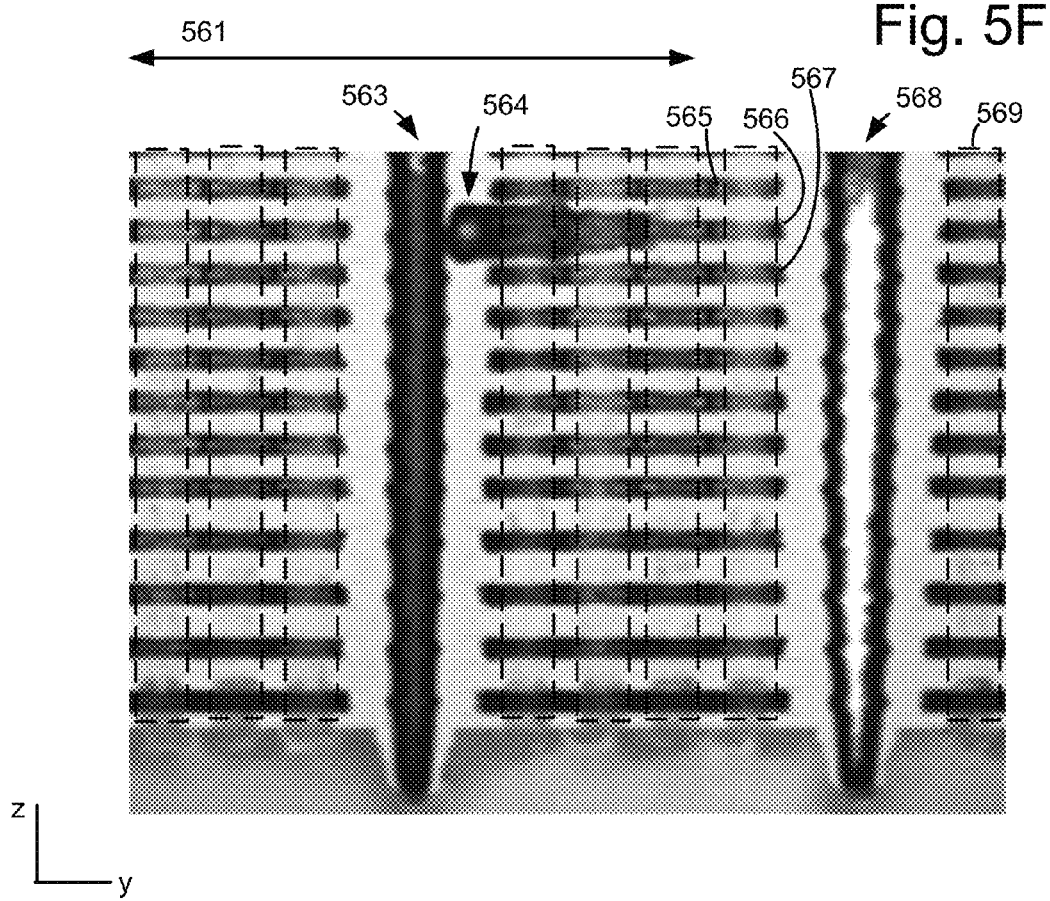
FIG. 5F depicts a cross-sectional view of the memory device of FIG. 5E along the arrow 561.

FIG. 5F depicts a cross-sectional view of the memory device of FIG. 5E along the arrow 561. Slits 563 and 568 are depicted. The dark rectangular regions represent word line layers, including word line layers 565, 566 and 567 which are shorted circuit by a region 564 of the conductive material which is used for the word line layers. Memory holes, such as example memory hole 569, can also be seen in dashed line boxes. The region 564 also contacts the slit 563.

FIG. 6A depicts an example programming operation in which a short circuit between word lines is detected. Step 600 begins a programming operation for a set of blocks. The different blocks, or different word lines of a block, can be programmed in a continuous process or at different times. As mentioned in connection with FIG. 5B, typically one block is programmed one word line at a time in a word line programming order before proceeding to program a next block. Step 601 initializes block index i=0, indicating that the first block (block0) is initially selected for programming Step 602 initializes a word line index n=0, indicating that the first word line of this block is initially selected for programming Step 603 attempts to program memory cells of the selected word line WLn (e.g., WLL0_0 in FIG. 5B). For example, this can involve performing a number of program loops or program-verify iterations. See, e.g., FIG. 7A. Each program loop comprises a program pulse which is applied to the selected word line. Typically, the program pulses begin at an initial level and are stepped up in each program loop until a program completion criterion is met or until a maximum allowable number of program loops have been performed. The program completion criterion can be met when all or nearly all (e.g., 95% or more) of the memory cells which are to be programmed to a target data state have successfully completed programming. In the case of a word line short circuit, the program completion criterion may not be met.

Thus, a control circuit of the memory device, to make a detection of a failure in an attempt to program data into memory cells of a particular word line layer in a block (a failure block), is configured to determine that the attempt to program data into the memory cells of the particular word line layer in the failure block does not meet a completion criterion within a maximum allowable number of program-verify loops. Further, the attempt to program data into the memory cells of the particular word line layer in the failure block may not meet the completion criterion when more than an allowable number of the memory cells (e.g., more than 5%) of the particular word line layer in the failure block do not reach a respective target data state (by sensing a Vth above the verify level of the respective target data state) within the maximum allowable number of program-verify loops.

After step 603, step 604 or 610 is reached. In a first path, at step 604, the programming of WLn in the ith block is successfully completed, e.g., the program completion criterion is met within the maximum allowable number of program loops. Decision step 605 determines if there is a next word line in the block to program. If decision step 605 is true, step 609 increments the word line index (n=n+1) and step 603 attempts to program memory cells of the next word line. If decision step 605 is false, a decision step 606 determines if there is a next block to program. If decision step 606 is true, step 608 increments the block index (i=i+1) and step 602 initializes the word line index n=0 for the new block. If decision step 606 is false, step 607 is reached, where the programming operation for the set of blocks is successfully completed.

In a second path after step 603, at step 610, the programming of WLn in the ith block has failed, e.g., the program completion criterion is not met within the maximum allowable number of program loops. A decision step 611 determines whether the currently selected word line, WLn, is shorted to the word line directly below it, WLn−1. WLn is a particular word line layer in a failure block which may be shorted to a first higher word line layer (e.g., WLn+1) above the particular word line layer and/or to a first lower word line layer (e.g., WLn−1) below the particular word line layer.

As indicated at step 611a, this can involve reading the memory cells of WLn−1 in the ith block to determine if they are all in a conductive state. For example, a read voltage of Vcgr_data may be used if WLn+1 is a data word line. If decision step 611 is true (these memory cells are all in the conductive state), it is concluded that WLn is shorted to WLn−1 in the ith block. In this case, step 612 indicates that no recovery process is performed for the memory cells of WLn on the other blocks. Generally, among shorted word line layers in a stack, a recovery process can be performed for the lowest word line layer. If decision step 611 is false, a decision step 613 determines whether WLn is shorted to WLn+1 in the ith block. As indicated at step 613a, this can involve reading the memory cells of WLn+1 in the ith block to determine if they are all in a conductive state. For example, a read voltage of Vcgr_data may be used if WLn+1 is a data word line, or Vcgr_dummy if WLn+1 is a dummy word line (see FIG. 8A). If decision step 613 is true (these memory cells are all in the conductive state), WLn is shorted to WLn+1 in the ith block. Recovery of data from WLn in other blocks is possible in this case. Specifically, step 614 performs a recovery process for memory cells in the previously-programmed blocks, if any, including the memory cells of WLn in the previously-programmed blocks. See FIG. 6B for further details. Without this recovery process, the data which was programmed on WLn in the other blocks could be lost.

For example, referring to FIG. 5B, if block2 is the current block in which a short circuit is detected, block0 and block1 are the previously-programmed blocks and block3 is an unprogrammed block. If decision step 613 is true, WLn is the lowest word line layer among shorted word line layers (e.g., WLn and WLn+1) in a stack. Note that a recovery process can be performed when WLn is shorted to multiple word line layers above it, e.g., WLn+1 and WLn+2, as well.

The decision step 611 could also determine whether the currently selected word line, WLn, is shorted to multiple adjacent word lines directly below it, e.g., WLn−1 and WLn−2. The decision step 613 could also determine whether the currently selected word line, WLn, is shorted to multiple adjacent word lines directly above it, e.g., WLn+1 and WL+2.

Note that, at step 610, the failure in the attempt to program data into memory cells of the particular word line layer in the failure block can occur after a number of successful attempt to program data into memory cells of the particular word line layer in the failure block in a plurality of previous program-erase cycles in the failure block.

FIG. 6B depicts an example recovery process consistent with step 614 of FIG. 6A. The recovery process begins at step 620. As mentioned, when a determination is made that, in an ith block, a particular word line layer, WLn, is short circuited to one or more word line layers above it, a recovery process can be performed to read data from WLn in one or more previously-programmed blocks. Step 621 involves selecting a previously-programmed block, e.g., block0. Step 622 involves reading data in the memory cells of WL0 to WLn−1, one word line layer at a time. This reading can use baseline read voltages such as VrEr/A, VrA/B and VrB/C. See FIG. 7B. Step 623 involves reading memory cells of WLn in the previously-programmed block using upshifted control gate voltages such as VrEr/A_up, VrA/B_up and VrB/C_up (see FIG. 7B) to compensate for a reduction in capacitive coupling from WLn+1. The upshifted control gate voltages help ensure that the data is read back correctly from WLn. The voltage on WLn+1 is the same as the voltage on WLn since the two word line layers are shorted together.

Moreover, the control gate voltage for each target data state can be upshifted by a different amount, where the amount is relatively higher when the target data state is relatively lower. For example, in FIG. 7B, VrEr/A_up, VrA/B_up and VrB/C_up are upshifted control gate voltages relative to VrEr/A, VrA/B and VrB/C, respectively. The amount and relative magnitudes of the upshifts are: VrEr/A_up-VrEr/A>VrA/B_up-VrA/B>VrB/C_up-VrB/C. In other words, for each target data state of the plurality of target data states, the upshifted control gate read voltage (VrEr/A_up, VrA/B_up or VrB/C_up) is higher than the corresponding baseline control gate read voltage (VrEr/A, VrA/B or VrB/C) by an amount which is relatively smaller when the target data state is relatively higher.

For example, for the case of no short circuit, to demarcate between the erased and A states, assume a baseline voltage of VrEr/A (e.g., 1 V) is applied to WLn while Vpass (e.g., 8 V) is applied to WLn−1 and WLn+1. CR is a coupling ratio between adjacent word lines. The amount of capacitive coupling which a memory cell on WLn receives from WLn−1 and WLn+1 is therefore: (8−1)×CR×2=14×CR. For the case of a short circuit between WLn and WLn−1, if we assume 1 V is applied to WLn and WLn−1 while 8 V is applied to WLn+1, the amount of capacitive coupling which a memory cell on WLn receives from WLn−1 is: (1−1)×CR=0 and the amount of capacitive coupling which a memory cell on WLn receives from WLn+1 is =(8−1)×CR=7×CR. There is a reduction in capacitive coupling of 7×CR. If we assume CR=0.1, the reduction in capacitive coupling is 0.7 V. To compensate for this change, VrEr/A can be increased by the same amount, e.g., from 1 V to 1.7 V (which is VrEr/A_up). Essentially, the effective control gate read voltage is made the same before and after the short circuit, where the effective control gate read voltage is equal to the driven level of the word line plus a voltage upshift due to capacitive coupling.

Note that the word line which are shorted together should have their voltage drivers provide a common output voltage so that the voltage at the control gates of the memory cells in predictable and at a desired level.

Similarly, to demarcate between the A and B states, assume a baseline voltage of VrA/B (e.g., 3 V) is applied to WLn while Vpass (e.g., 8 V) is applied to WLn−1 and WLn+1. The amount of capacitive coupling which a memory cell on WLn receives from WLn−1 and WLn+1 is: (8−3)×CR×2=10×CR. For the case of a short circuit between WLn and WLn−1, if we assume 3 V is applied to WLn and WLn−1 while 8 V is applied to WLn+1, the amount of capacitive coupling which a memory cell on WLn receives from WLn−1 is: (3−3)×CR=0 and the amount of capacitive coupling which a memory cell on WLn receives from WLn+1 is =(8−3)×CR=5×CR. There is a reduction in capacitive coupling of 5×CR. With CR=0.1, the reduction in capacitive coupling is 0.5 V. To compensate for this change, VrA/B can be increased by the same amount, e.g., from 3 V to 3.5 V (which is VrA/B_up).

Similarly, to demarcate between the B and C states, assume a baseline voltage of VrB/C (e.g., 5 V) is applied to WLn while Vpass (e.g., 8 V) is applied to WLn−1 and WLn+1. The amount of capacitive coupling which a memory cell on WLn receives from WLn−1 and WLn+1 is: (8−5)×CR×2=6×CR. For the case of a short circuit between WLn and WLn−1, if we assume 5 V is applied to WLn and WLn−1 while 8 V is applied to WLn+1, the amount of capacitive coupling which a memory cell on WLn receives from WLn−1 is: (5−5)×CR=0 and the amount of capacitive coupling which a memory cell on WLn receives from WLn+1 is =(8−5)×CR=3×CR. There is a reduction in capacitive coupling of 3×CR. With CR=0.1, the reduction in capacitive coupling is 0.3 V. To compensate for this change, VrB/C can be increased by the same amount, e.g., from 5 V to 5.3 (which is VrB/C_up).

A control circuit, to read data from memory cells of the particular word line layer (WLn) in the first non-failure block (block0), is configured to apply an upshifted control gate read voltage (VrEr/A_up, VrA/B_up or VrB/C_up) to the particular word line layer in the first non-failure block for each target data state of the plurality of target data states, and sense whether each memory cell of the particular word line layer in the first non-failure block is in a conductive state during each upshifted control gate read voltage. For each target data state of the plurality of target data states, the upshifted control gate read voltage is higher than a corresponding baseline control gate read voltage (VrEr/A, VrA/B or VrB/C) used to read data from memory cells of the particular word line layer in the first non-failure block when the particular word line layer in the failure block is not shorted to one or more other word line layers in the failure block.

A decision step 624 determines whether uncorrectable errors exist in the data read from WLn. Error Correction Code (ECC) decoding can determine that a memory cell is supposed to be in a certain data state even when the memory cell is read as being in another data state. For example, a memory cell for which Vth<VrB/C, indicating a B state memory cell, may be corrected to represent the C state. An ECC code can have redundancies which allow a limited number of errors to be detected and corrected. Examples of ECC techniques include Low-Density Parity Check (LDPC) codes, Turbo codes and concatenated codes. LDPC codes are highly efficient linear block codes made from many single parity check (SPC) codes. Turbo codes use iterative soft-decoding and combine two or more relatively simple convolutional codes and an interleaver to produce a block code. Concatenated codes combine algebraic block codes and convolutional codes. The state machine or controller can evaluate the memory cells based on the read results, perform the ECC decoding and determine whether there are any uncorrectable errors.

If decision step 624 is true, step 627 reads the memory cells of WLn in the previously-programmed block using fine increments in the control gate voltages on WLn. See FIG. 8C. This is a backup measure which may be able to read WLn with no uncorrectable errors. The presence of an uncorrectable error is generally unacceptable since the original data is corrupted. For example, this fine reading can include a plurality of control gate read voltages, where a number of control gate read voltages in the plurality of control gate read voltages is at least twice a number of target data states in the plurality of target data states.

Decision step 628 determines whether uncorrectable errors exist in the data read from WLn in step 627. If decision step 628 is false, the recovery process for the block is successful (step 625). At step 626, the controller programs the recovered data of WLn to another block, e.g., in a different set of blocks in the memory device. A decision step 630 determines if there is another previous-programmed block to recover data from. If decision step 630 is true, a next previously-programmed block is selected at step 621. If decision step 630 is false, the recovery process is completed at step 631.

If decision step 628 is true, the recovery process for the block has failed, and the host programs the data to another block (step 629) if it still has the data.

If decision step 624 is false, the recovery process for the block is successful (step 625).

Note that the read using the fine increments in step 627 can be performed in place of the read using the baseline control gate read voltages in step 623.

Figure 7A:
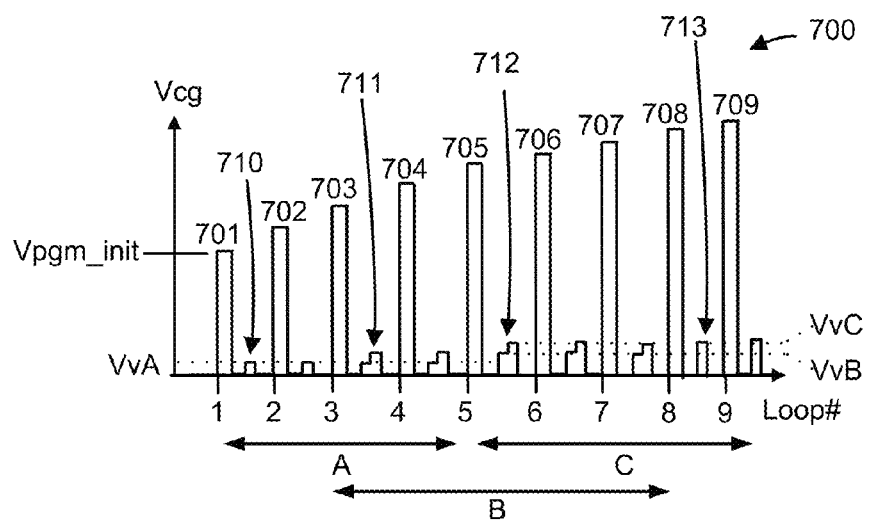
FIG. 7A depicts voltages applied to a selected word line during programming, consistent with step 603 of FIG. 6A.

FIG. 7A depicts voltages applied to a selected word line during programming, consistent with step 603 of FIG. 6. The vertical axis depicts Vcg, control gate or word line voltage, and the horizontal axis depicts time or program loop number. A one pass programming operation with four data states is depicted. Other options are possible. The programming operation comprises a series of waveforms 700. Incremental step pulse programming is performed for each target data state. This example also performs verify tests based on the program loop. For example, the A, B and C state cells are verified in loops 1-4, 3-7 and 5-9, respectively. An example verify waveform 710 comprises an A state verify voltage at VvA. An example verify waveform 711 comprises A and B state verify voltages at VvA and VvB, respectively. An example verify waveform 712 comprises B and C state verify voltages at VvB and VvC, respectively. An example verify waveform 713 comprises a C state verify voltage at VvC. The program voltages (pulses) 701-709 are also depicted. An initial program pulse has the magnitude of Vpgm_init. A program pulse is a waveform that increases from an initial value, e.g., 0 V, to a peak value, in one or more steps, and then back to the initial value, typically. A maximum allowable number of program loops can be enforced, e.g., 15-20 program loops.

Figure 7B:
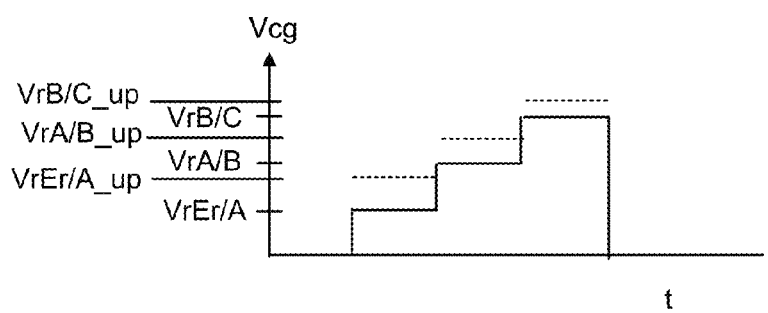
FIG. 7B depicts voltages applied to a selected word line during a read operation, consistent with steps 622 and 623 of FIG. 6B.

FIG. 7B depicts voltages applied to a selected word line during a read operation, consistent with steps 622 and 623 of FIG. 6B. The vertical axis depicts Vcg and the horizontal axis depicts time. In the example of four data states, including three target data states, there are three baseline read voltages VrEr/A, VrA/B and VrB/C and three upshifted voltages VrEr/A_up, VrA/B_up and VrB/C_up for the A, B and C states, respectively. The example can be extended to another number of data states, e.g., eight or sixteen. A baseline read voltage is used on a word line which is not shorted circuited while an upshifted control gate read voltage is used on word lines which are shorted circuited to one another.

Figure 8A:
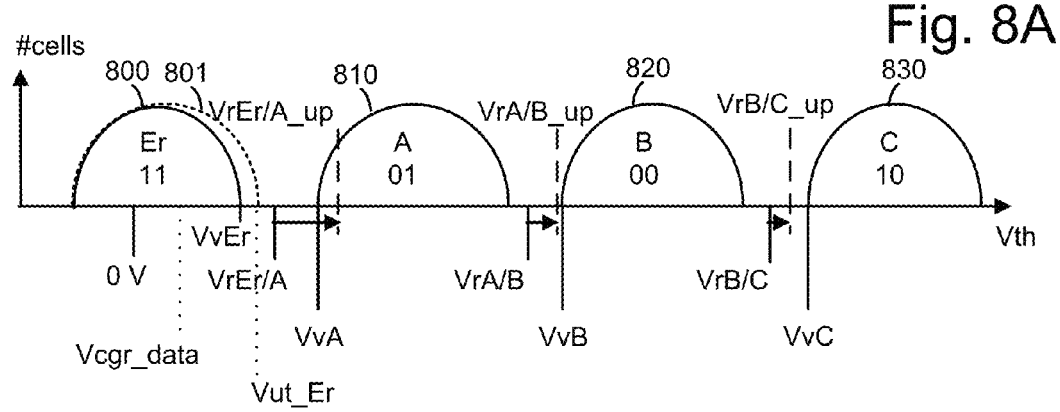
FIG. 8A depicts a threshold voltage (Vth) distribution of a set of data memory cells, in addition to baseline read voltages VrEr/A, VrA/B and VrB/C and upshifted control gate read voltages VrEr/A_up, VrA/B_up and VrB/C_up, consistent with steps 622 and 623 of FIG. 6B.
Figure 8B:
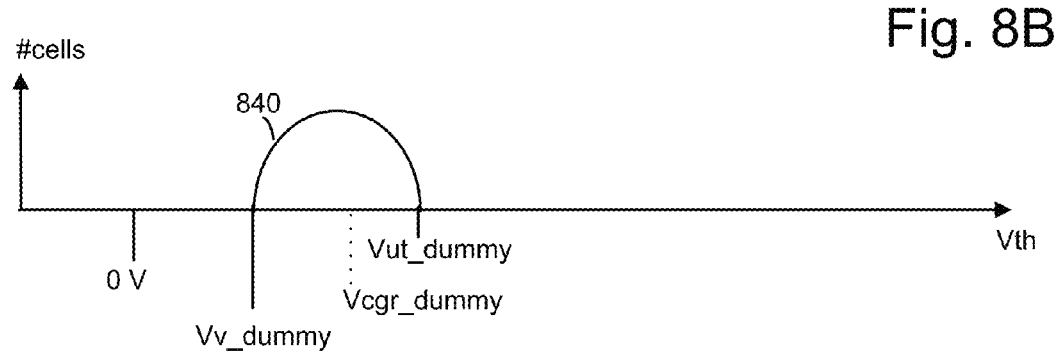
FIG. 8B depicts a Vth distribution of a set of dummy memory cells, in addition to a read voltage, Vcgr_dummy, consistent with step 613a of FIG. 6A.
Figure 8C:
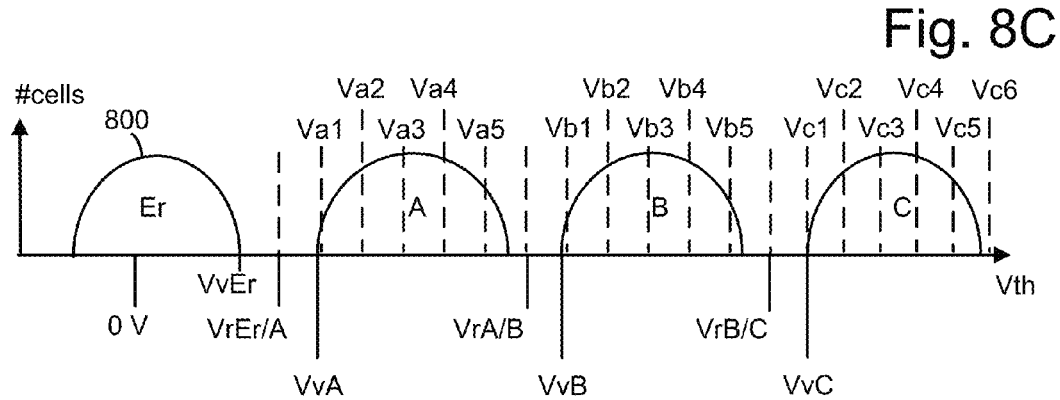
FIG. 8C depicts the Vth distribution of FIG. 8A, showing voltages using in a fine reading process consistent with step 627 of FIG. 6B.

In FIG. 8A to 8C, the horizontal axis depicts Vth and the vertical axis depicts a number of memory cells on a logarithmic scale.

FIG. 8A depicts a threshold voltage (Vth) distribution of a set of data memory cells, in addition to baseline read voltages VrEr/A, VrA/B and VrB/C and upshifted control gate read voltages VrEr/A_up, VrA/B_up and VrB/C_up, consistent with steps 622 and 623 of FIG. 6B. Example Vth distributions for the memory cell array are provided for a case where each memory cell stores two bits of data in one of four possible Vth ranges. One bit represents the lower data and the other bit represents the upper page data.

A first Vth distribution 800 is provided for erased (Er) state memory cells. Three Vth distributions 810, 820 and 830 represent target data states A, B and C, respectively, which are reached by memory cells when their Vth exceeds the erase-verify voltage VvA, VvB or VvC, respectively.

A programming operation can use one or more programming passes. A one pass programming operation involves (only) one sequence of multiple program-verify operations (or program loops) which are performed starting from an initial Vpgm level and proceeding to a final Vpgm level until the threshold voltages of a set of selected memory cells reach one or more respective verify voltages of respective target data states. All memory cells may initially be in the erased state at the beginning of the programming pass.

After the programming pass is completed, the data can be read from the memory cells using read reference voltages VrEr/A, VrA/B and VrB/C which are between the Vth distributions. At the same time, a read pass voltage, Vpass (e.g., 8-9 V), is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

An erase operation involves one or more erase-verify loops which lower the Vth of the memory cells. The erase operation may cause the programmed memory cells to transition from the Vth distributions 810, 820 and 830 to the Vth distribution 800.

An upshifted Vth distribution 801 is also depicted for the erased state. This upshift is caused by program disturb.

Vcgr_data is an example of a control gate voltage which may be used to read data memory cells to determine if there is a short circuit, consistent with steps 611a and 613a (if step 613a is for a data word line and not a dummy word line). Vut_Er represents an upper tail of the erased state Vth distribution. Generally, Vcgr_data can be 0 V or more, but below Vut_Er. Vcgr_data should be lower than the Vth of some data memory cells (including erased state memory cells) so that some memory cells on a word line are sensed as being in a non-conductive state when the word line is not shorted. This allows the memory device to distinguish the case where at least some data memory cells on the word line are in a non-conductive state from the case where all data memory cells on the word line are in a conductive state. As an example, Vcgr_data can be 0-0.5 V.

FIG. 8B depicts a Vth distribution of a set of dummy memory cells, in addition to a read voltage, Vcgr_dummy, consistent with step 613a of FIG. 6A. The dummy memory cells have a Vth that is set at the time of manufacture, where the Vth level does not represent a data state. The Vth distribution 840 is an example for a set of dummy memory cells. Vv_dummy is a verify level used during programming and Vut_dummy represents an upper tail of the Vth distribution. Vcgr_dummy is an example of a control gate voltage which may be used to read dummy memory cells to determine if there is a short circuit, consistent with step 613a (if step 613a is for a dummy word line). Generally, Vcgr_dummy can be 0 V or more. Vcgr_dummy should be higher than the Vth of some dummy memory cells so that some dummy memory cells on a word line are sensed as being in a non-conductive state when the word line is not shorted. That is, Vcgr_dummy should be lower than a threshold voltage of at least some of the dummy memory cells. This allows the memory device to distinguish the case where at least some dummy memory cells on the word line are in a non-conductive state from the case where all dummy memory cells on the word line are in a conductive state.

FIG. 8C depicts the Vth distribution of FIG. 8A, showing voltages using in a fine reading process consistent with step 627 of FIG. 6B. The dashed lines represent the read levels. The read levels which can be used to identify the A state memory cells are VrEr/A, Va1, Va2, Va3, Va4, Va5 and VrA/B. The read levels which can be used to identify the B state memory cells are VrA/B, Vb1, Vb2, Vb3, Vb4, Vb5 and VrB/C. The read levels which can be used to identify the C state memory cells are VrB/C, Vc1, Vc2, Vc3, Vc4, Vc5 and Vc6. A fine read process can determine the shape of a Vth distribution and this information can be used to estimate the data state of a memory cell with greater accuracy using probabilistic techniques.

FIG. 9A depicts a circuit diagram comprising example NAND strings 910 and 911 in a failure block (e.g., block2), showing an example of voltages which are consistent with step 611a of FIG. 6A. Step 611a involved reading memory cells of WLn−1 to determine if they are all in a conductive state. Typically, each word line layer can be connected to either a separate respective voltage driver or to a common pass voltage driver 906 using appropriate switches (transistors) and control signals (not shown). Moreover, corresponding word line layers in different blocks can be driver by a common voltage driver. For example, the word line layers depicted are DWLL1a_2, DWLL1b_2, WLL22_2, WLL21_2, WLL20_2 and WLL19_2 (consistent with FIG. 5B), and the respective voltage drivers are DWLL1a driver 900, DWLL1b driver 901, WLL22 driver 902, WLL21 driver 903, WLL20 driver 902 and WLL19 driver 905, respectively. The word line layers are connected to memory cells 920, 921, 922, 923, 924 and 925 in NAND string 910 and to memory cells 930, 931, 932, 933, 934 and 935 in NAND string 911. SC1 depicts a short circuit between WLL21 and WLL22. The voltage drivers can also be connected to other blocks, e.g., block0, block1 and block3 (not shown here) via the interconnect structure of FIG. 5A.

In this example, WLL21_2 is WLn−1 in step 611a. Accordingly, the memory cells 923 and 933 are sensed while Vcgr_data (from FIG. 8A) is applied to WLL21_2. To achieve this, WLL21_2 is connected to the WLL21 driver, which provides an output voltage at Vcgr_data. The remaining word line layers are connected to the pass voltage driver which provides an output voltage of Vpass (e.g., 8-9 V). If WLL21_2 is not short circuited to WLL22_2, the effective voltage seen by the memory cells 923 and 933 is the relatively low Vcgr_data. If WLL21_2 is short circuited to WLL22_2, the effective voltage seen by the memory cells 923 and 933 is closer to the relatively high Vpass. In this case, the voltage output of the pass voltage driver dominates the voltage output of the WLL21 driver since the pass voltage driver has a higher capacity or ability to drive a load. The pass voltage driver has this higher capacity because it is designed to drive multiple word line layers concurrently while the separate respective voltage drivers are designed to drive just one word line layer.

If the memory cells connected to WLL21_2 see an effective voltage of Vcgr_data, some of them will be in a non-conductive state because Vcgr_data is not lower than the lower tail Vth of the erased state and it will be concluded that WLL21_2 is not shorted to WLL22_2. If the memory cells connected to WLL21_2 see an effective voltage of Vpass, or close to Vpass (e.g., ~Vpass), all of them will be in a conductive state because ~Vpass is higher than the upper tail Vth of the highest target data state and it will be concluded that WLL21_2 is shorted to WLL22_2. ~Vpass is higher than a threshold voltage of each of the memory cells of WLL21_2.

FIG. 9B depicts a table of voltages consistent with FIG. 9A for a case 1 in which there is no short between WLn and WLn−1 and a case 2 in which there is a short between WLn and WLn−1. The applied voltage is the voltage output from a driver, and the effective voltage is the voltage seen at the control gates of the memory cells. For the case of no short circuit, the applied voltage (Vcgr_data or Vpass) is equal to the effective voltage for the different word lines. For the case of a short circuit, the applied voltage is not equal to the effective voltage. Instead, the effective voltage is ~Vpass on both word lines.

FIG. 10A depicts a circuit diagram comprising the example NAND strings 910 and 911 of FIG. 9A, showing an example of voltages which are consistent with step 613a of FIG. 6A. Step 613a involved reading memory cells of WLn+1 to determine if they are all in a conductive state. The pass voltage driver and respective voltage drivers of FIG. 9A are repeated. SC2 depicts a short circuit between WLL22_2 and DWLL1b_2.

In this example, DWLL1b_2 is WLn+1 in step 613a. Accordingly, the memory cells 921 and 931 are sensed while Vcgr_dummy (from FIG. 8B) is applied to DWLL1b_2. To achieve this, DWLL1b_2 is connected to the DWLL1b driver 911, which provides an output voltage at Vcgr_dummy. The remaining word line layers are connected to the pass voltage driver which provides an output voltage of Vpass (e.g., 8-9 V). If DWLL1b_2 is not short circuited to WLL22_2, the effective voltage seen by the memory cells 921 and 931 is the relatively low Vcgr_dummy. If DWLL1b_2 is short circuited to WLL22_2, the effective voltage seen by the memory cells 921 and 931 is closer to the relatively high Vpass, since the voltage output of the pass voltage driver dominates the voltage output of the DWLL1b driver.

If the memory cells connected to DWLL1b_2 see an effective voltage of Vcgr_dummy, some of them will be in a non-conductive state because Vcgr_dummy is not lower than the lower tail Vth of the dummy Vth distribution and it will be concluded that DWLL1b_2 is not shorted to WLL22_2. If the memory cells connected to DWLL1b_2 see an effective voltage of ~Vpass, all of them will be in a conductive state because ~Vpass is higher than the upper tail Vth of the dummy Vth distribution and it will be concluded that DWLL1b_2 is shorted to WLL22_2.

In this example, WLL22_2 is a particular word line layer in a failure block and DWLL1b_2 is a first higher word line layer in the failure block. Moreover, WLL22_2 is a data word line and DWLL1b_2 is a dummy word line.

FIG. 10B depicts a table of voltages consistent with FIG. 10A for a case 3 in which there is no short between WLn and WLn+1 and a case 4 in which there is a short between WLn and WLn+1. The applied voltage is the voltage output from a driver, and the effective voltage is the voltage seen at the control gates of the memory cells. For the case of no short circuit, the applied voltage (Vcgr_dummy, Vcgr_data or Vpass) is equal to the effective voltage for the different word lines. For the case of a short circuit, the applied voltage is not equal to the effective voltage. Instead, the effective voltage is ~Vpass on both word lines.

In a variation of FIG. 10A, WLn+1 is a data word line and the respective voltage driver provides an output of Vcgr_data. In this variation, WLL21 can be a particular word line layer in a failure block and WLL22 is a first higher word line layer in the failure block. The first higher word line layer in the failure block is after the particular word line layer in the failure block in a word line programming order of the failure block so that the first higher word line is unprogrammed during the read of memory cells of the first higher word line layer in the failure block. That is, WLL22 has not been programmed at the time WLL21 fails its programming attempt. In a block, WLL0-WLL20 have been programmed at the time WLL21 fails its programming attempt.

FIG. 11 depicts a circuit diagram comprising example NAND strings 1110 and 1111 in a non-failure block (e.g., block0), showing an example of voltages which are consistent with step 623 of FIG. 6B. Step 623 involved reading memory cells of WLn in a previously-programmed block using upshifted control gate voltages on WLn (and WLn+1), to compensate for a reduction in coupling from WLn+1. The pass voltage driver and respective voltage drivers of FIGS. 9A and 10A are repeated. The short circuit SC2 from FIG. 10A is repeated as it connects WLL22_0 and DWLL1b_0.

In this example, the DWLL1b voltage driver 1111 and the WLL22 voltage driver 1112 both provide an upshifted control gate read voltage (e.g., VrEr/A_up, VrA/B_up or VrB/C_up) during a read operation, consistent with FIG. 7B. Since the voltage drivers of the short circuited word line layers provide the same output, the effective voltage seen by the memory cells 1121, 1131, 1122 and 1132 is equal to the output voltage and there is no competition between the voltage drivers.

The word line layers depicted are DWLL1a_0, DWLL1b_0, WLL22_0, WLL21_0, WLL20_0 and WLL19_0 (consistent with FIG. 5B), and the respective voltage drivers are DWLL1a driver 900, DWLL1b driver 901, WLL22 driver 902, WLL21 driver 903, WLL20 driver 902 and WLL19 driver 905, respectively, as in FIG. 9A. The word line layers are connected to memory cells 1120, 1121, 1122, 1123, 1124 and 1125 in NAND string 1110 and to memory cells 1130, 1131, 1132, 1133, 1134 and 1135 in NAND string 1111. The voltage drivers can also be connected to other blocks, e.g., block1, block2 and block3 (not shown here) via the interconnect structure of FIG. 5A.

Accordingly, it can be seen that, in one embodiment, a memory device (100) comprises: a first non-failure block (block0, block1), the first non-failure block comprises memory cells (1120-1125, 1130-1135) arranged in a plurality of word line layers (DWLL2a, DWLL2b, WLL0, . . . , WLL22, DWLL1b, DWLL1a); a failure block (block2), the failure block comprises memory cells (920-925, 930-935) arranged in a plurality of word line layers which correspond to the plurality of word line layers of the first non-failure block; an interconnect structure (515) which connects each word line layer of the plurality of word line layers of the first non-failure block to a corresponding word line layer of the plurality of word line layers of the failure block; and a control circuit (110, 112, 114, 116, 122, 128, 132, SB1, SB2, . . . , SBp). The control circuit is configured to: program data into memory cells of the first non-failure block; make a detection of a failure in an attempt to program data into memory cells (922, 932) of a particular word line layer (WLL22_2) in the failure block; in response to the detection of the failure, make a determination that the particular word line layer in the failure block is shorted to a first higher word line layer (DWLL1b_2) above the particular word line layer but not to a first lower word line layer (WLL21_2) below the particular word line layer; and in response to the determination, read data from memory cells of a particular word line layer (WLL22_2) in the first non-failure block (block1) which corresponds to the particular word line layer of the failure block.

In another embodiment, a method for operating a memory device (100) comprises: programming data into memory cells (1120-1125, 1130-1135) of a first non-failure block (block0, block1), the first non-failure block comprises memory cells arranged in a plurality of word line layers (DWLL2a, DWLL2b, WLL0, . . . , WLL22, DWLL1b, DWLL1a); detecting a failure in an attempt to program data into memory cells of a particular word line layer (WLL22_2) in a failure block (block2), the failure block comprises memory cells (920-925, 930-935) arranged in a plurality of word line layers which correspond to the plurality of word line layers of the first non-failure block, and an interconnect structure (515) connects each word line layer of the plurality of word line layers of the first non-failure block to a corresponding word line layer of the plurality of word line layers of the failure block; in response to the detecting of the failure, determining that the particular word line layer in the failure block is shorted to a first higher word line layer (DWLL1b_2) in the failure block above the particular word line layer but not to a first lower word line layer (WLL21_2) in the failure block below the particular word line layer; and in response to the determining, reading data from memory cells (1122, 1132) of a particular word line layer (WLL22_0) in the first non-failure block (block0) which corresponds to the particular word line layer of the failure block.

In another embodiment, a memory controller (122) comprises: a storage device (122a, 122b, 126a) comprising a set of instructions (160) and a processor (122c) operable to execute the set of instructions. The set of instructions comprises: instructions to detect a failure in an attempt to program data into memory cells (922, 932) of a particular word line layer (WLL22_2) in a block (161); instructions to determine that the particular word line layer is shorted to a word line layer (DWLL1b_2) above the particular word line layer but not to a word line layer (WLL21_2) below the particular word line layer (162); instructions to perform a recovery read of data from memory cells (1122, 1132) in a particular word line layer (WLL22_0) of a previously-programmed block using upshifted control gate read voltages (VrEr/A_up, VrA/B_up, VrB/C_up), wherein for each target data state of a plurality of target data states, the upshifted control gate read voltage is higher than a corresponding baseline control gate read voltage (VrEr/A, VrA/B or VrB/C) (163); and instructions to program the recovered data to another set of blocks (164).

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A memory device, comprising:
   a first non-failure block, the first non-failure block comprises memory cells arranged in a plurality of word line layers;
   a failure block, the failure block comprises memory cells arranged in a plurality of word line layers which correspond to the plurality of word line layers of the first non-failure block;
   an interconnect structure which connects each word line layer of the plurality of word line layers of the first non-failure block to a corresponding word line layer of the plurality of word line layers of the failure block; and
   a control circuit, the control circuit is configured to:
      program data into memory cells of the first non-failure block;
      make a detection of a failure in an attempt to program data into memory cells of a particular word line layer in the failure block;
      in response to the detection of the failure, make a determination that the particular word line layer in the failure block is shorted to a first higher word line layer above the particular word line layer but not to a first lower word line layer below the particular word line layer; and
      in response to the determination, read data from memory cells of a particular word line layer in the first non-failure block which corresponds to the particular word line layer of the failure block.

2. The memory device of claim 1, wherein:
   the control circuit, to make the detection of the failure, is configured to determine that the attempt to program data into the memory cells of the particular word line layer in the failure block does not meet a completion criterion within a maximum allowable number of program-verify loops.

3. The memory device of claim 2, wherein:
   the attempt to program data into the memory cells of the particular word line layer in the failure block does not meet the completion criterion when more than an allowable number of the memory cells of the particular word line layer in the failure block do not reach a respective target data state within the maximum allowable number of program-verify loops.

4. The memory device of claim 1, wherein:
   the control circuit, to make the determination, is configured to read memory cells of the first higher word line layer in the failure block and determine that the memory cells of the first higher word line layer in the failure block are all in a conductive state, and to read memory cells of the first lower word line layer in the failure block and determine that the memory cells of the first lower word line layer in the failure block are not all in the conductive state.

5. The memory device of claim 4, wherein:
   the control circuit, to read the memory cells of the first higher word line layer in the failure block, is configured to connect a voltage driver to the first higher word line layer in the failure block and to connect a voltage driver to the particular word line layer in the failure block;
   a voltage output by the voltage driver connected to the first higher word line layer in the failure block is lower than a voltage output by the voltage driver connected to the particular word line layer in the failure block and lower than a threshold voltage of at least some of the memory cells of the first higher word line layer in the failure block; and
   the voltage output by the voltage driver connected to the particular word line layer in the failure block is higher than a threshold voltage of each of the memory cells of the first higher word line layer in the failure block and a threshold voltage of each of the memory cells of the particular word line layer in the failure block.

6. The memory device of claim 4, wherein:
   the control circuit, to read the memory cells of the first lower word line layer in the failure block, is configured to connect a voltage driver to the first lower word line layer in the failure block and to connect a voltage driver to the particular word line layer in the failure block;
   a voltage output by the voltage driver connected to the first lower word line layer in the failure block is lower than a voltage output by the voltage driver connected to the particular word line layer in the failure block and lower than a threshold voltage of at least some of the memory cells of the first higher word line layer in the failure block; and
   the voltage output by the voltage driver connected to the particular word line layer in the failure block is higher than a threshold voltage of each of the memory cells of the first lower word line layer in the failure block and a threshold voltage of each of the memory cells of the particular word line layer in the failure block.

7. The memory device of claim 4, wherein:
the particular word line layer in the failure block and the first higher word line layer in the failure block are data word line layers in the failure block; and
the first higher word line layer in the failure block is after the particular word line layer in the failure block in a word line programming order of the failure block so that the first higher word line is unprogrammed during the read of the memory cells of the first higher word line layer in the failure block.

8. The memory device of claim 1, wherein:
the attempt to program data into the memory cells of the particular word line layer in the failure block result in a short circuit between the first higher word line layer in the failure block and the particular word line layer in the failure block.

9. The memory device of claim 1, wherein:
the control circuit is configured to make a determination that the particular word line layer in the failure block is shorted to a second higher word line layer above the first higher line layer in the failure block, and to perform the read of the data from the memory cells of the particular word line layer in response to the determination that the particular word line layer in the failure block is shorted to the second higher word line layer.

10. The memory device of claim 1, wherein:
the memory cells of the particular word line layer in the first non-failure block store data in a plurality of target data states; and
the control circuit, to read data from memory cells of the particular word line layer in the first non-failure block, is configured to apply an upshifted control gate read voltage to the particular word line layer in the first non-failure block for each target data state of the plurality of target data states, and sense whether each memory cell of the particular word line layer in the first non-failure block is in a conductive state during each upshifted control gate read voltage, wherein, for each target data state of the plurality of target data states, the upshifted control gate read voltage is higher than a corresponding baseline control gate read voltage used to read data from memory cells of the particular word line layer in the first non-failure block when the particular word line layer in the failure block is not shorted to one or more other word line layers in the failure block.

11. The memory device of claim 10, wherein:
the control circuit, to read the data from memory cells of the particular word line layer in the first non-failure block, is configured to apply the upshifted control gate read voltage to a word line layer above the particular word line layer in the first non-failure block for each target data state of the plurality of target data states.

12. The memory device of claim 10, wherein:
for each target data state of the plurality of target data states, the upshifted control gate read voltage is higher than the corresponding baseline control gate read voltage by an amount which is relatively smaller when the target data state is relatively higher.

13. The memory device of claim 10, wherein:
if the read of the data from memory cells of the particular word line layer in the first non-failure block results in uncorrectable errors, the control circuit, to perform an additional read of data from the memory cells of the particular word line layer in the first non-failure block, is configured to apply a plurality of control gate read voltages in turn to the particular word line layer in the first non-failure block for each target data state of the plurality of target data states, and sense whether each memory cell of the particular word line layer in the first non-failure block is in a conductive state during each control gate read voltage, wherein a number of control gate read voltages in the plurality of control gate read voltages is at least twice a number of target data states in the plurality of target data states.

14. The memory device of claim 1, wherein:
the memory cells of the particular word line layer in the first non-failure block store data in a plurality of target data states; and
the control circuit, to read data from memory cells of the particular word line layer in the first non-failure block, is configured to apply a plurality of control gate read voltages in turn to the particular word line layer in the first non-failure block for each target data state of the plurality of target data states, and sense whether each memory cell of the particular word line layer in the first non-failure block is in a conductive state during each control gate read voltage, wherein a number of control gate read voltages in the plurality of control gate read voltages is at least twice a number of target data states in the plurality of target data states.

15. The memory device of claim 1, further comprising:
a second non-failure block, the second non-failure block comprises memory cells arranged in a plurality of word line layers which correspond to the plurality of word line layers of the first non-failure block; and
an interconnect structure which connects each word line layer of the plurality of word line layers of the second non-failure block to a corresponding word line layer of the plurality of word line layers of the first non-failure block in the memory device, wherein the control circuit is configured to:
program data into memory cells of the second non-failure block; and
in response to the determination that the particular word line layer in the failure block is shorted to one or more other word line layers in the failure block, read data from memory cells of a particular word line layer in the second non-failure block which corresponds to the particular word line layer of the failure block.

16. The memory device of claim 1, wherein:
the first non-failure block comprises a terrace comprising end portions of the word line layers of the first non-failure block;
the failure block comprises a terrace comprising end portions of the word line layers of the failure block; and
the interconnect structure comprises vias extending upward from the terrace of the first non-failure block and connected to vias extending upward from the terrace of the failure block.

17. The memory device of claim 1, wherein:
the particular word line layer in the failure block is a topmost data word line layer in the failure block; and
the first higher word line layer in the failure block is a dummy word line layer in the failure block.

18. A method for operating a memory device, comprising:
programming data into memory cells of a first non-failure block, the first non-failure block comprises memory cells arranged in a plurality of word line layers;
detecting a failure in an attempt to program data into memory cells of a particular word line layer in a failure block, the failure block comprises memory cells arranged in a plurality of word line layers which correspond to the plurality of word line layers of the first non-failure block, and an interconnect structure connects each word line layer of the plurality of word line layers of the first non-failure block to a corresponding word line layer of the plurality of word line layers of the failure block;

in response to the detecting of the failure, determining that the particular word line layer in the failure block is shorted to a first higher word line layer in the failure block above the particular word line layer but not to a first lower word line layer in the failure block below the particular word line layer; and in response to the determining, reading data from memory cells of a particular word line layer in the first non-failure block which corresponds to the particular word line layer of the failure block.

19. The method of claim 18, further comprising:

the determining comprises reading memory cells of the first higher word line layer in the failure block and determining that the memory cells of the first higher word line layer in the failure block are all in a conductive state, and reading memory cells of the first lower word line layer in the failure block and determine that the memory cells of the first lower word line layer in the failure block are not all in the conductive state.

20. The method of claim 18, wherein:

the memory cells of the particular word line layer in the first non-failure block store data in a plurality of target data states; and the reading of the data comprises applying an upshifted control gate read voltage to the particular word line layer in the first non-failure block for each target data state of the plurality of target data states, and sensing whether each memory cell of the particular word line layer in the first non-failure block is in a conductive state during each upshifted control gate read voltage, wherein, for each target data state of the plurality of target data states, the upshifted control gate read voltage is higher than a corresponding baseline control gate read voltage used to read data from memory cells of the particular word line layer in the first non-failure block when the particular word line layer in the failure block is not shorted to one or more other word line layers in the failure block.

21. The method of claim 20, wherein:

for each target data state of the plurality of target data states, the upshifted control gate read voltage is higher than the corresponding baseline control gate read voltage by an amount which is relatively smaller when the target data state is relatively higher.

22. A memory controller, comprising:

a non-transitory storage device comprising a set of instructions, the set of instructions comprising:

instructions to detect a failure in an attempt to program data into memory cells of a particular word line layer in a block;

instructions to determine that the particular word line layer is shorted to a word line layer above the particular word line layer but not to a word line layer below the particular word line layer;

instructions to perform a recovery read of data from memory cells in a particular word line layer of a previously-programmed block using upshifted control gate read voltages, wherein for each target data state of a plurality of target data states, the upshifted control gate read voltage is higher than a corresponding baseline control gate read voltage; and instructions to program the recovered data to another set of blocks; and a processor operable to execute the set of instructions.

23. The memory controller of claim 22, wherein:

for each target data state of the plurality of target data states, the upshifted control gate read voltage is higher than the corresponding baseline control gate read voltage by an amount which is relatively smaller when the target data state is relatively higher.

* * * * *